(12) United States Patent
Jones et al.

(10) Patent No.: US 9,612,309 B2
(45) Date of Patent: Apr. 4, 2017

(54) MAGNETOMETER TEST ARRANGEMENT AND METHOD

(71) Applicants: Peter T. Jones, Scottsdale, AZ (US);
David T. Myers, Gilbert, AZ (US);
Franklin P. Myers, Mesa, AZ (US);
Jim D. Pak, Gilbert, AZ (US)

(72) Inventors: Peter T. Jones, Scottsdale, AZ (US);
David T. Myers, Gilbert, AZ (US);
Franklin P. Myers, Mesa, AZ (US);
Jim D. Pak, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 87 days.

(21) Appl. No.: 14/599,076

(22) Filed: Jan. 16, 2015

(65) Prior Publication Data

US 2015/0130443 A1  May 14, 2015

Related U.S. Application Data

(62) Division of application No. 13/032,107, filed on Feb. 22, 2011, now Pat. No. 8,963,538.

(51) Int. Cl.
*G01R 33/00* (2006.01)
*G01R 31/01* (2006.01)
*G01R 35/00* (2006.01)

(52) U.S. Cl.
CPC ....... *G01R 35/005* (2013.01); *G01R 33/0035* (2013.01); *Y10T 29/49004* (2015.01)

(58) Field of Classification Search
CPC ............................... G01R 31/01; G01R 33/00
USPC ............................................. 324/756.05, 262
See application file for complete search history.

(56) References Cited

U.S. PATENT DOCUMENTS 5,157,325 A * 10/1992 Murphy .................... 324/750.2
7,215,519 B2 * 5/2007 Blumenauer et al. .......... 361/42

* cited by examiner

*Primary Examiner* — Bot Ledynh

(57) ABSTRACT

Manufacturing of magnetometer units employs a test socket having a substantially rigid body with a cavity therein holding an untested unit in a predetermined position proximate electrical connection thereto, wherein one or more magnetic field sources fixed in the body provide known magnetic fields at the position so that the response of each unit is measured and compared to stored expected values. Based thereon, each unit can be calibrated or trimmed by feeding corrective electrical signals back to the unit through the test socket until the actual and expected responses match or the unit is discarded as uncorrectable. In a preferred embodiment, the magnetic field sources are substantially orthogonal coil pairs arranged so that their centerlines coincide at a common point within the predetermined position. Because the test-socket is especially rugged and compact, other functions (e.g., accelerometers) included in the unit can also be easily tested and trimmed.

19 Claims, 15 Drawing Sheets

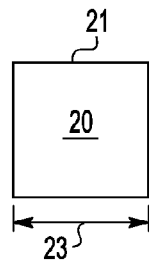 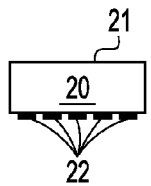 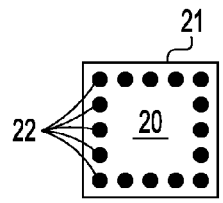 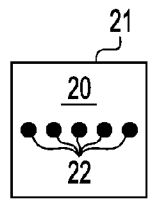
FIG. 1A  FIG. 1B  FIG. 1C  FIG. 1D
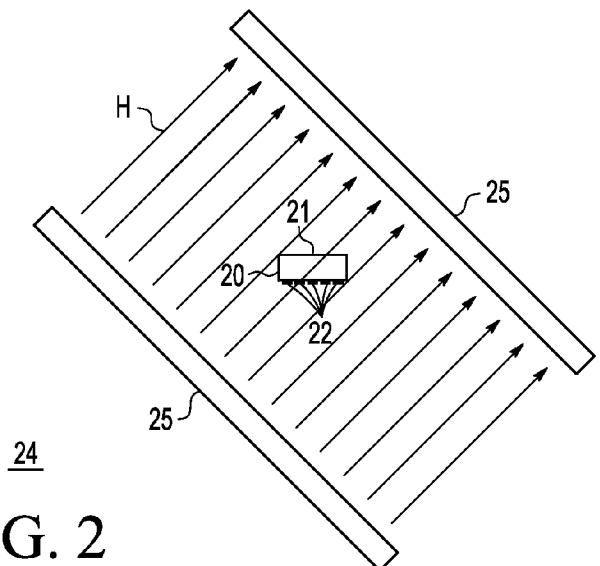
FIG. 2
- PRIOR ART -
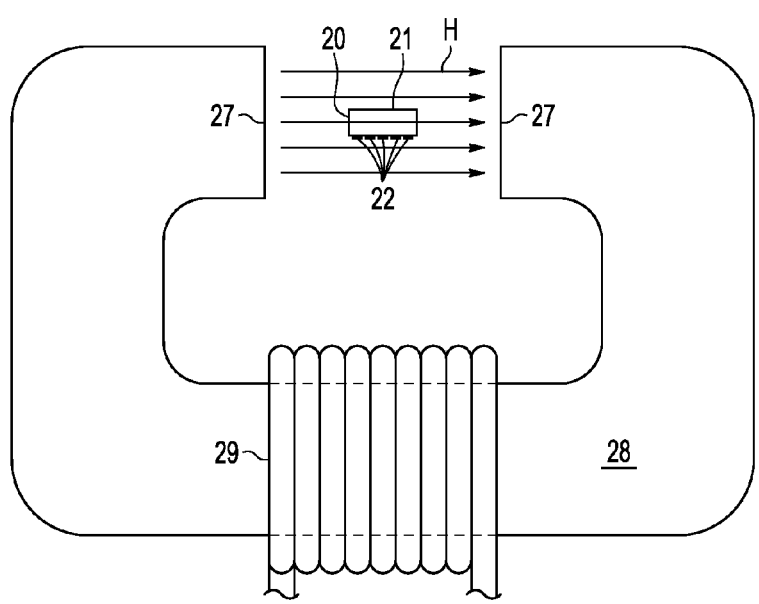
FIG. 3
- PRIOR ART -

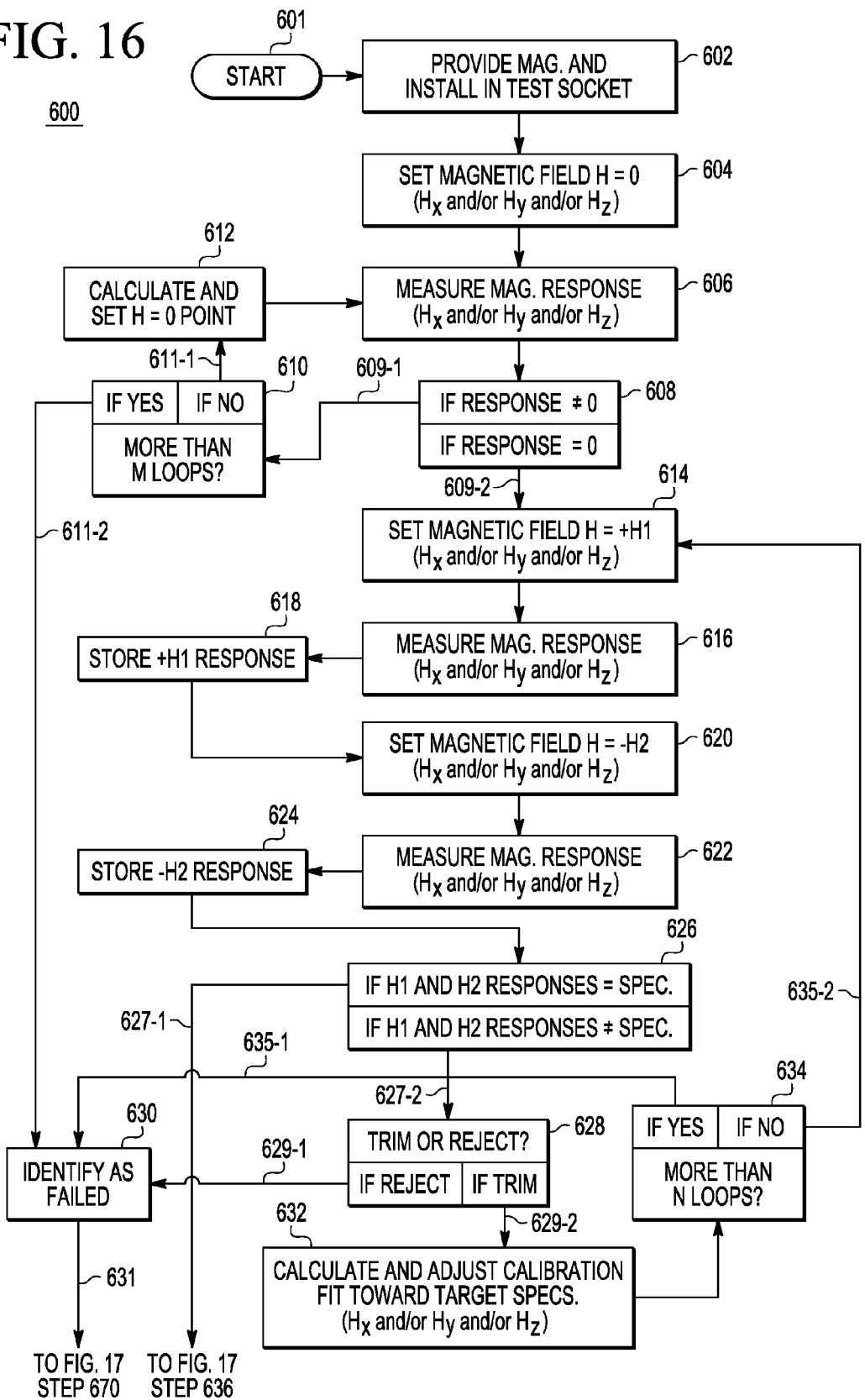

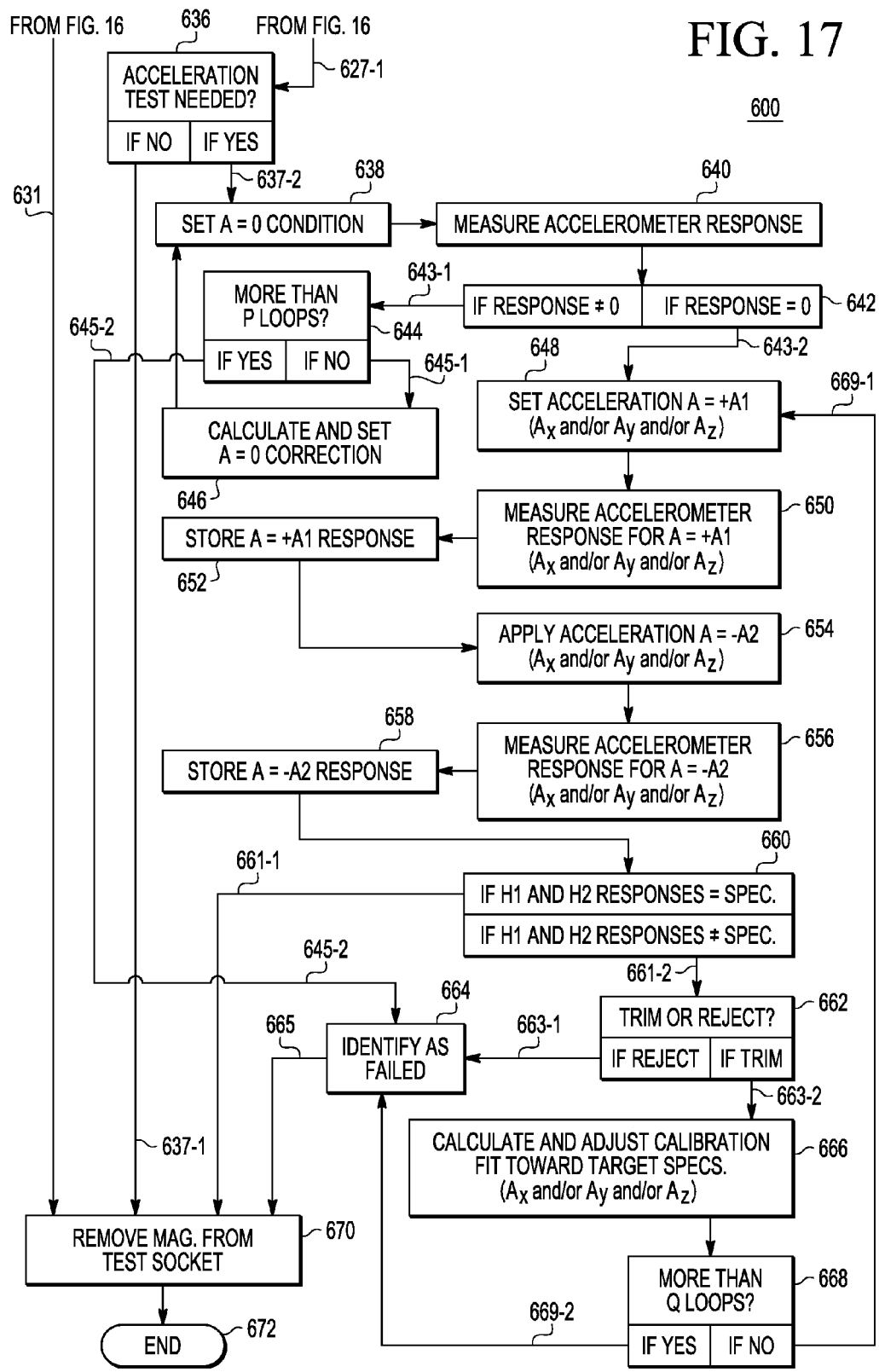

MAGNETOMETER TEST ARRANGEMENT AND METHOD

CROSS-REFERENCE TO RELATED APPLICATION

This application is a divisional of co-pending U.S. application Ser. No. 13/032,107, filed Feb. 22, 2011.

FIELD OF THE INVENTION

Embodiments of this invention relate generally to arrangements, sockets, and methods for testing and/or calibrating magnetometers, and to magnetometers that have been so tested and/or calibrated.

BACKGROUND OF THE INVENTION

A magnetometer is an electronic device for detecting the magnitude and/or orientation of a magnetic field. It is customary to test magnetometers in magnetic fields of known strength and orientation to determine their response and, in some cases adjust or "trim" the magnetometers to provide a predetermined output in response to known magnetic fields. This process is generally referred to as calibration and is a routine aspect of producing useful magnetometers. In some cases, other tests relating to, for example, acceleration, temperature, etc., may also be performed on magnetometers, especially where the magnetometers are intended for use in stressful environments.

BRIEF DESCRIPTION OF THE DRAWINGS

Embodiments of the invention will be better understood from a reading of the following detailed description, taken in conjunction with the accompanying figures in the drawings in which like numerals denote like or analogous elements, and wherein:

FIGS. 1A, 1B, 1C, and 1D (collectively FIG. 1) show simplified top, side and bottom views, respectively, of exemplary magnetometers;

FIG. 2 shows a schematic side view of the magnetometer of FIG. 1 between a pair of electromagnetic coils for providing a unidirectional magnetic field passing through the magnetometer of FIG. 1, according to the prior art;

FIG. 3 shows a schematic side view of the magnetometer of FIG. 1 between the poles of a magnetic yoke for providing a unidirectional magnetic field passing through the magnetometer of FIG. 1, according to the prior art;

FIGS. 16 and 17 show simplified methods for testing and/or trimming a magnetometer (which may also include other functions) using test arrangements comprising test sockets of the types illustrated in FIGS. 5-14 and the electrical portion of FIG. 15, according to additional embodiments of the invention.

DETAILED DESCRIPTION OF THE INVENTION

Figure 4A:
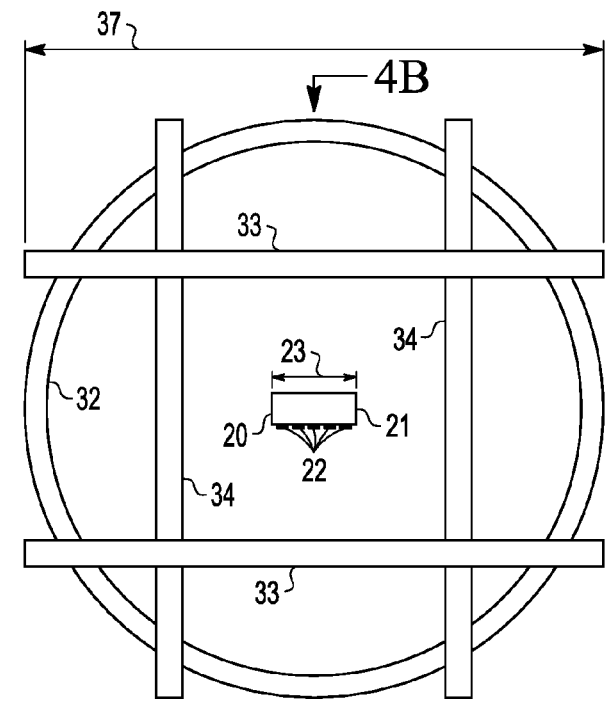
FIG. 4A shows a simplified side view and FIG. 4B shows a simplified top view of the magnetometer of FIG. 1 in a three-dimensional Helmholtz coil arrangement for providing a test magnetic field of any three-dimensional (3-D) orientation passing through the magnetometer of FIG. 1, according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

The terms "trim" and "trimming" with reference to magnetometers are used herein to refer to altering the properties of a magnetometer so that when exposed to a stimulus (e.g., a magnetic field and/or acceleration and/or temperature and/or other physical environment) its output response to such stimulus more closely matches the expected or desired response from the magnetometer when exposed to such stimulus. This is also commonly called "calibrate" or "calibrating", and the terms "trim" and "trimming" and "calibrate" or "calibrating" are used interchangeably herein.

FIGS. 1A, 1B, 1C, and 1D show simplified top (FIG. 1A), side (FIG. 1B) and bottom (FIGS. 1C & 1D) views, respectively, of exemplary magnetometer 20 encased in body 21 and with electrical input-output (I/O) contacts or terminals 22. FIGS. 1C and 1D are non-limiting illustrations of different configurations of I/O contacts or terminals 22. Any type of magnetic field sensor may be used as the active element within magnetometer 20 for detecting a magnetic field. Hall Effect semiconductor devices are well known magnetic field sensors but other types of sensors may also be used. Embodiments of the present invention do not depend upon the type of magnetic field sensor used within magnetometer 20. In addition to including at least one magnetic field sensor of some type, it is common in the art that other types of electronic devices, particularly semiconductor devices and integrated circuits (ICs), may be incorporated within magnetometer 20 to provide a variety of further electronic functions (e.g., differential magnetic field detections, detection of acceleration, temperature, etc.), and especially to allow magnetometer 20 to be trimmed to suit particular functions.

Magnetometer 20 may be a unidirectional magnetometer, that is, adapted to respond substantially to magnetic fields in a particular direction with respect to magnetometer 20, or may be a multidirectional magnetometer adapted to detect magnetic fields in multiple directions (e.g., in three dimensions), thereby providing information on the orientation of the magnetic field as well as its magnitude. For convenience of description, I/O contacts or terminals 22 are shown as being located on the lower surface of body 21 of magnetometer 20, but may be located anywhere on magnetometer 20 and may be of any type. Non-limiting example of various contacts or terminals are solder bumps, surface contact pads, beam leads, externally extending leads, dual in-line leads, etc. Magnetometer 20 may include any or all of such variations as well as having other external and internal configurations. Magnetometer 20 may also be of a contactless type wherein communication to and from the magnetometer is handled wirelessly.

FIG. 2 shows a schematic side view of testing arrangement 24 according to the prior art, wherein magnetometer 20 of FIG. 1 is located between a pair of electro-magnetic coils 25 providing substantially unidirectional magnetic field H passing through magnetometer 20. Coil pair 25 shown in side view in FIG. 2 and is generally circular in plan view.

FIG. 3 shows a schematic side view of testing arrangement 26 according to the prior art, wherein magnetometer 20 is located between poles 27 of magnetic yoke 28 energized by current carrying coil 29 for providing substantially unidirectional magnetic field H passing through magnetometer 20.

Figure 4B:
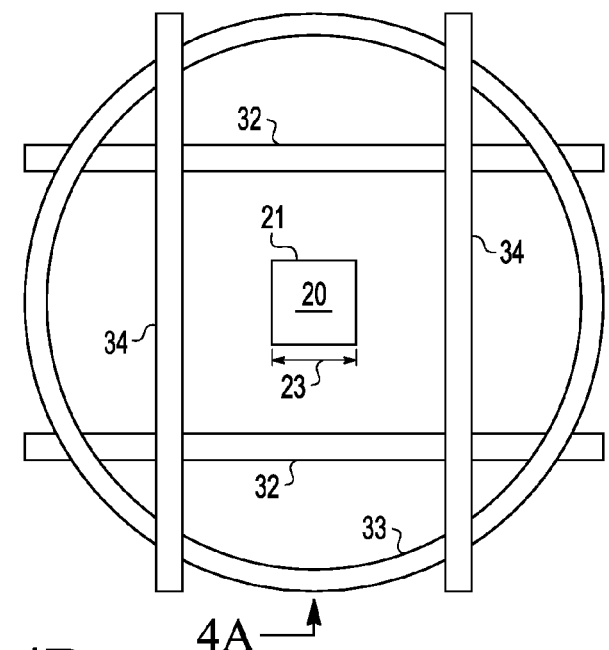

FIG. 4A shows a simplified side view and FIG. 4B shows a simplified top view of magnetometer 20 of FIG. 1 placed in three-dimensional (3-D) Helmholtz coil arrangement 30 for providing a test magnetic field of any orientation passing through magnetometer 20, according to the prior art. To avoid cluttering the drawing, the magnetic field produced by the combination of orthogonally arranged coil pairs 32, 33 and 34 is not indicated in FIGS. 4A and 4B (collectively FIG. 4). By varying the relative drive current provided to each of coil pairs 32, 33 and 34, the resulting magnetic field used to test magnetometer 20 can be oriented in any spatial direction with respect to magnetometer 20.

While any of arrangements 24, 26, 30 can be used for generating magnetic fields for testing magnetometer 20, in practical manufacturing such prior art arrangements have proved unwieldy. Among other things, the overall sizes of conventional magnetic field generating arrangements 24, 26, 30 of FIGS. 2-4 are bulky and ill suited to volume manufacture. For example, dimension 37 of 3-D Helmholtz coil arrangement 30 of FIG. 4 is typically several orders of magnitude larger than dimension 23 of magnetometer 20. Stated another way, for example, the cubic volume occupied by 3-D Helmholtz coil arrangement 30 of FIG. 4 is typically $3 \times 10^4$ to $3 \times 10^8$ times the cubic volume of magnetometer 23. Further, it is found that, despite care to render the magnetic fields produced by any of arrangements 24, 26, 30 substantially uniform where magnetometer 20 is located, the exact magnetic field to which magnetometer 20 is being exposed is sensitive to its exact position within arrangements 24, 26, 30, and such problems tend to worsen as the overall size of arrangements 24, 26, 30 is reduced to facilitate their use in volume manufacturing. Further difficulties arise when magnetometer 20 contains other types of sensors as well as magnetic field sensors, for example, acceleration and/or temperature sensors. A problem with prior art testing arrangements such as are illustrated in FIGS. 2-4 is that they are poorly adapted (e.g., too fragile) to permit concurrent testing of such other functions. Accordingly, there is an ongoing need for improved test arrangements and methods and magnetometers tested thereby, in which these and other difficulties associated with testing and calibrating or trimming magnetometers are reduced or eliminated. Among other things, the test sockets used to hold and energize a magnetometer and orient it with respect to a test magnetic field and the method of performing such test(s) are important aspects of the magnetometer manufacturing process and have great impact on the cost of manufacture and usefulness of a finished magnetometer product.

Figure 5:
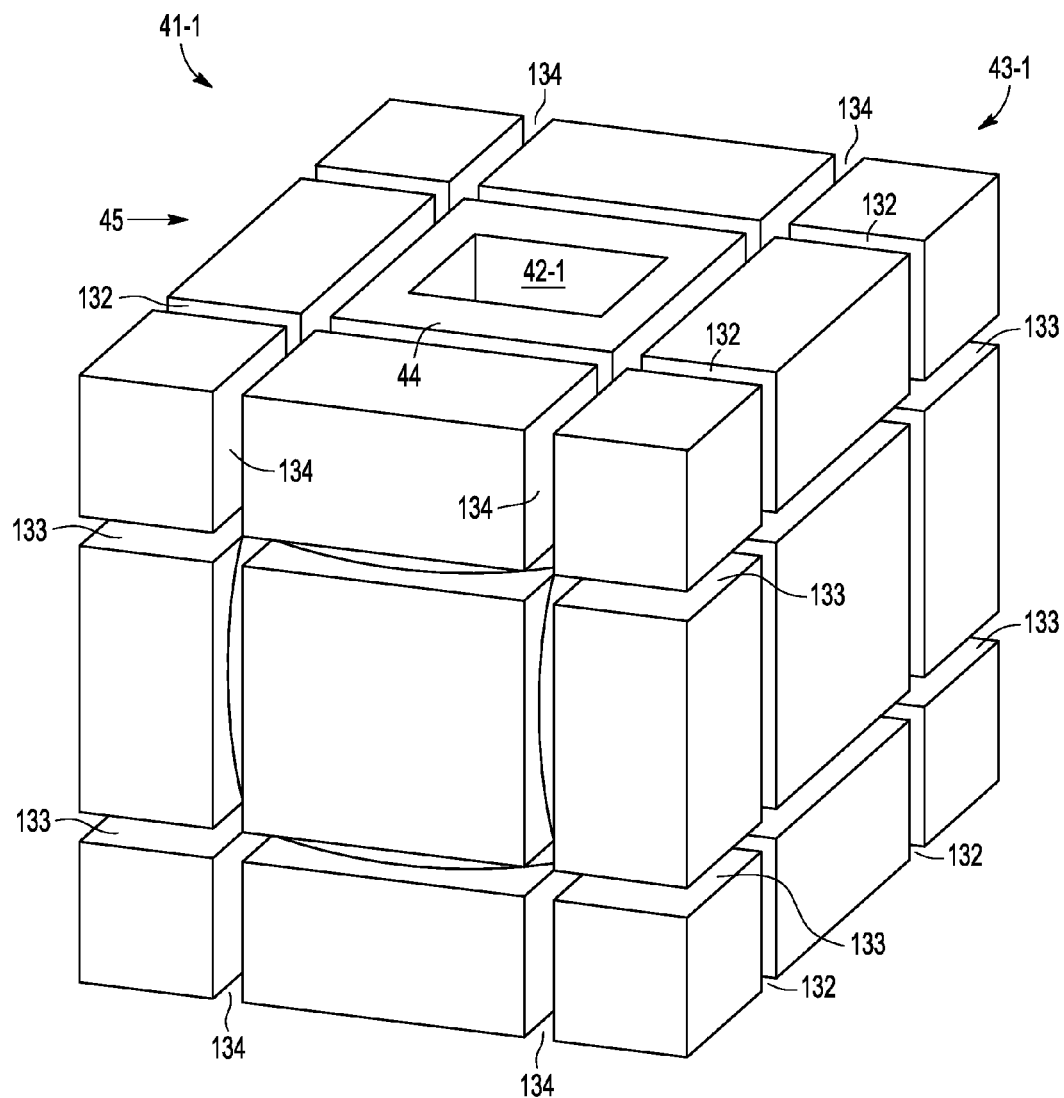
FIG. 5 shows a simplified isometric view of an arrangement for testing the magnetometer of FIG. 1, according to an embodiment of the invention, wherein a test socket for holding the magnetometer in predetermined relationship to Helmholtz coils analogous to those of FIGS. 4A and 4B is only partially completed.

FIG. 5 shows a simplified isometric view of arrangement 40-1 for testing the magnetometer of FIG. 1, according to an embodiment of the invention, wherein test socket 41-1 for holding the magnetometer in predetermined relationship to Helmholtz coils analogous to those of FIGS. 4A and 4B is only partially completed. Test arrangement 40-1 comprises test socket 41-1 having body 43-1 formed from substantially non-magnetic material. Ceramic-filled PEEK (polyether ether ketone), polyimides such as Vespel® available from DuPont Inc. of Newark, Del., or polyamide-imides such as Torlon® available from Boedeker Corp. of Shiner, Tex., and liquid crystal polymer (LCP) are non-limiting examples of suitable materials for body 43-1 but other substantially non-magnetic materials can also be used provided that the resulting body is substantially rigid, so that the location(s) of magnetic field source(s) and the magnetometer under test are substantially constrained. Ceramic-filled PEEK (polyether ether ketone) is preferred for body 43-1. Body 43-1 has therein cavity 42-1 for holding magnetometer 20 in a predetermined relationship to a magnetic field being generated within test socket 41-1.

Body 43-1 has substantially orthogonal pairs of slots 132, 133, 134 in which coils analogous to coils 32, 33, 34 of FIG. 4 will be placed (e.g., see coil pairs 332, 333, 334 of FIGS. 6-7 and 11-13), thereby forming a 3-D Helmholtz magnetic field generating arrangement in this embodiment. Substantially orthogonal slot pairs 132, 133, 134 are shown in FIG. 5, but the conductors making up the corresponding coil pairs (e.g., see coil pairs 332, 333, 334 of FIGS. 6-7 and 11-13) are omitted from FIG. 5 in order to avoid unduly cluttering the drawing. It will be understood by those of skill in the art that substantially orthogonal slot pairs 132, 133, 134 are for the purpose of holding substantially orthogonal Helmholtz coil pairs analogous to coil pairs 32, 33, 34 of FIG. 4, as are shown for example in FIGS. 6.-7 and 11-13. Some or all of these coil pairs are energized during testing, calibration and or trimming to expose magnetometer 20 located within cavity 42-1 in body 43-1 of test socket 41-1 of test arrangement 40-1 to a desired magnetic field. Cavity 42-1 extends from upper surface 44 substantially into the center of text socket 41-1, as can be seen more clearly in FIGS. 6-7 and 11-13. Reference number 45 indicates the approximate location of the cross-sections shown in FIGS. 6-7, 11-13 and elsewhere.

Figure 6:
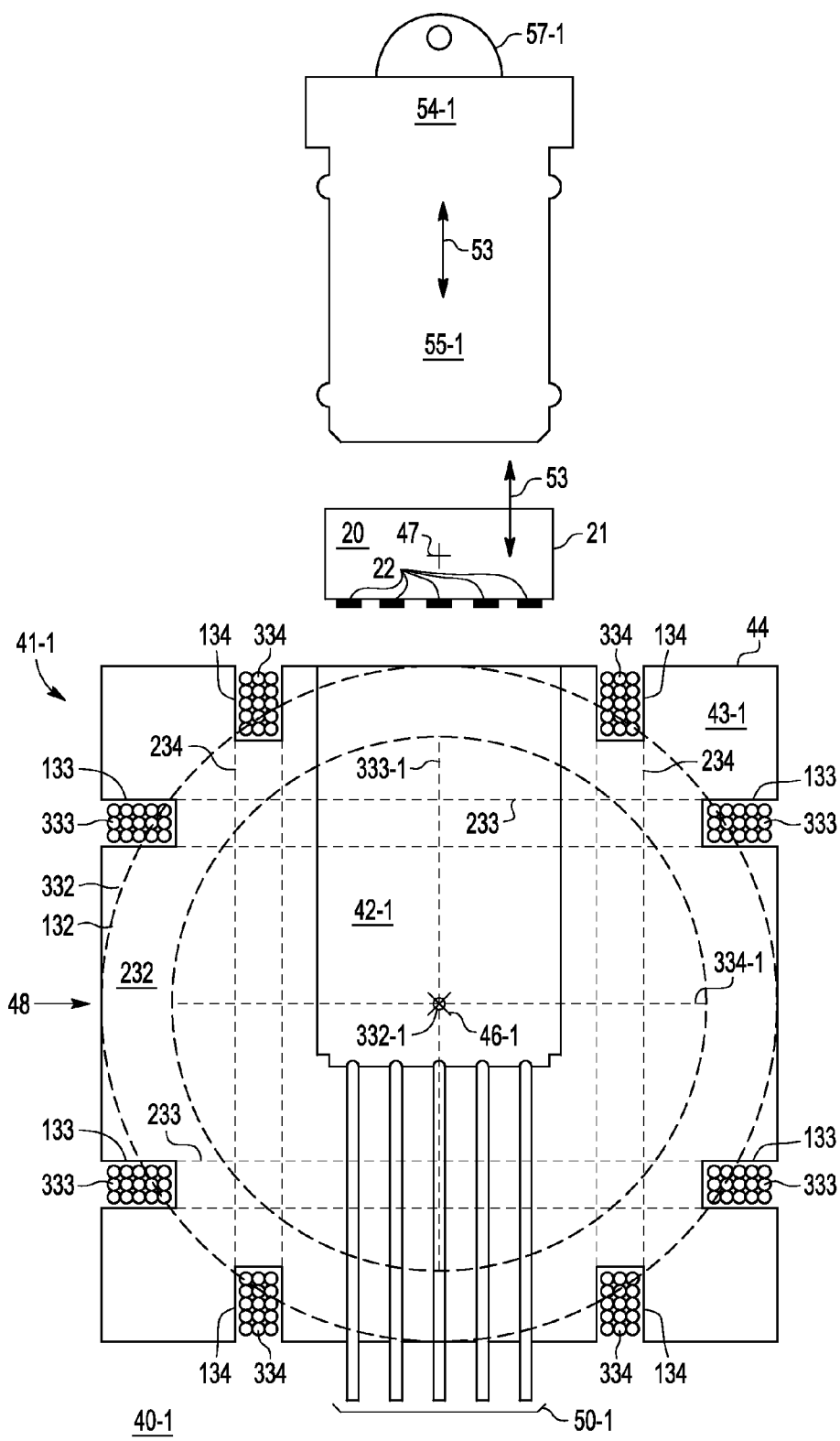
FIG. 6 shows a simplified exploded cross-sectional view of the test socket of FIG. 5 for holding the magnetometer of FIG. 1 during test and/or calibration, illustrating how the magnetometer of FIG. 1 may be inserted or removed from the test socket of FIG. 5.
Figure 7:
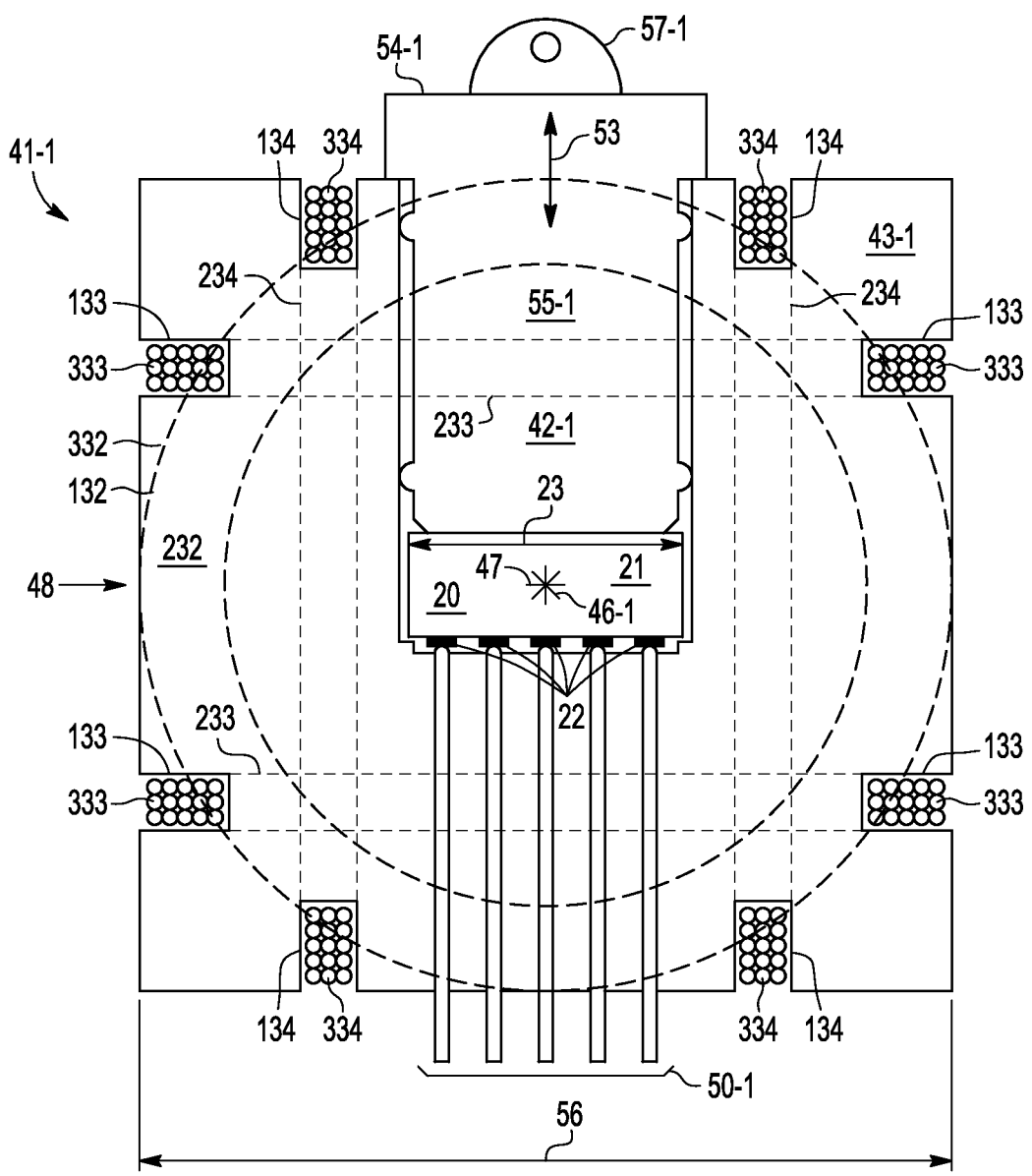
FIG. 7 shows a simplified cross-sectional view of the test socket of FIG. 6 after the magnetometer of FIG. 1 has been positioned within the test socket.

FIG. 6 shows a simplified exploded cross-sectional view of test arrangement 40-1 comprising test socket 41-1 of FIG. 5 for holding magnetometer 20 of FIG. 1 in cavity 42-1, illustrating how magnetometer 20 may be inserted and removed from cavity 42-1 of test socket 41-1. FIG. 7 shows a simplified cross-sectional view of test arrangement 40-1 comprising test socket 41-1 of FIGS. 5-6 after magnetometer 20 is placed within test socket 41-1. FIGS. 6 and 7 are discussed together. The cross-sectional views of FIGS. 6 and 7 are substantially vertical cross-sections through central portion 45 of test socket 41-1 of FIG. 5. It is assumed in FIGS. 6-7 (and FIGS. 8-14) that terminals 22 of magnetometer 20 are arranged as shown in FIG. 1D, but this is merely for convenience of illustration and not intended to be limiting. Persons of skill in the art will understand that the electrical connections (e.g. connections 50-1 through 50-8) within socket 41-1 and sockets 41-2 through 41-8 are located so as to mate with whatever configuration of terminals 22 is present on magnetometer 20.

Referring now to FIGS. 6-7, test socket 41-1 comprises body 43-1 of preferably non-magnetic material as previously discussed. Slot pairs 132, 133, 134 containing electromagnetic coils 332, 333, 334 respectively, are provided in body 43-1. Slot pairs 132, 133, 134 preferably define a substantially round central armature around which coils pairs 332, 333, 334 are formed or placed, although such shape is not essential. Accordingly, coil pairs 332, 333, 334 are generally circular in plan view, although other plan view shapes may be used in other embodiments. Slot pairs 132, 133, 134 and corresponding coil pairs 332, 333, 334 are desirably substantially orthogonal to one another. For example, slot pair 134 and corresponding coil pair 334 have principal planes 234 that are substantially vertical in FIGS. 6-7. Slot pair 133 and corresponding coil pair 333 have principal planes 233 that are substantially horizontal in FIGS. 6-7. Slot pair 132 and corresponding coil pair 332 have principal planes 232 that are also generally vertical in FIGS. 6-7, but arranged so that principal planes 232 are oriented at substantially 90 degrees with respect to principal planes 233 and 234.

In a preferred embodiment, centerline 332-1 passing between coil pair 332, centerline 333-1 passing between coil pair 333, and centerline 334-1 passing between coil pair 334 are substantially orthogonal and intersect at common point 46-1. In a preferred embodiment, common point 46-1 is located within cavity 42-1 in zone or position 48 within cavity 42-1 substantially where magnetometer 20 will be located when it is placed in test socket 41-1 (e.g., see FIG. 7). The outer perimeter of cavity 42-1 is conveniently shaped so as to substantially conform to body 21 of magnetometer 20, or at least have guides related to the shape of body 21 so that magnetometer 20 fits snugly into zone or position 48 within cavity 42-1 where terminals 22 of magnetometer 20 can come into contact with electrical connection or test pins 50-1 of test socket 41-1. It is desirable for manufacturing convenience that cavity 42-1 and/or body 21 of magnetometer 20 have some form of mutual alignment keys or shapes (not shown) to inhibit magnetometer 20 being inserted in cavity 42-1 in an incorrect azimuthal orientation. However, this is not essential. Connection or test pins 50-1 are preferably but not essentially of a spring-loaded variety (e.g., "pogo pins") so that slight differences (e.g., in elevation) of terminals 22 of magnetometer 20 are accommodated. Any type of flexible connection (e.g., test pins) 50-1 may be used.

While cavities 42-1 through 42-8 (collectively cavities 42) shown in FIGS. 5-14 are shown as having substantially straight (e.g., vertical) sidewalls, this is merely for convenience of description and not intended to be limiting. The interior walls of cavities 42 may be sloped to facilitate easy entry therein of magnetometer 20 in the direction of arrow 53, provided that the lower portion (e.g., zone or position 48) within cavity 42 where magnetometer 20 comes to rest during testing (e.g., see FIGS. 7-14) is sufficiently confining to provide the desired alignment of terminals 22 to connection or test pins 50-1 though 50-8 (collectively connection or test pins 50) or other connection means (e.g., see FIG. 13), and the desired alignment of magnetometer 20 to the magnetic field being created by yoke or coils 281, 332, 333, 334, 335, 336 of FIGS. 7-14.

Referring again to FIGS. 6-7, cap 54-1 having central extension or tang 55-1 and optional connection point 57-1 is desirably but not essentially provided. Cap 54-1 is adapted so that tang or extension 55-1 is inserted into cavity 42-1 following magnetometer 20 to ensure that magnetometer terminals 22 are firmly seated against connection or test pins 50-1 to provide electrical contact thereto. Coupling point 57-1 is desirably but not essentially included to facilitate coupling cap 45-1 with extension or tang 55-1 to, for example, a pick-and-place (P&P) machine to facilitate automatic insertion of magnetometer 20 and cap 54-1 into (and removal from) socket 41-1. Cap 54-1 with extension or tang 55-1 also facilitates making sure that magnetometer 20 is reliably positioned in zone or position 48 proximate intersection point 46-1 where the most uniform portion of the magnetic field generated by, for example, coils 332, 333, 334 of FIGS. 6-7 is located. In a further embodiment, it is desirable that point 47 of magnetometer 20 indicating the location(s) within body 21 of the magnetic sensor(s) used for detecting the magnetic field passing through magnetometer 20, is brought into close proximity with central magnetic field intersection point 46-1 of test socket 41-1.

The foregoing testing arrangement has a number of significant advantages. For example, it is compact, having outer dimension 56 (see FIG. 7) much less than outer dimension 37 of the prior art arrangements of, for example FIG. 4. For example, outer dimension 56 is generally less than about 16 times, conveniently less than about 10 times and preferably less than about 4.5 times dimension 23 of magnetometer 20. Stated another way, where the cubic volume occupied by test socket 41-1 of FIGS. 5-7 (and FIGS. 8-14) is $V_{TS}$ and the cubic volume of magnetometer 23 is $V_{MAG}$, then the ratio $V_{TS}/V_{MAG}$ is usefully about $V_{TS}/V_{MAG} \leq 2.8 \times 10^4$, more conveniently about $V_{TS}/V_{MAG} \leq 1.25 \times 10^4$, and preferably about $V_{TS}/V_{MAG} \leq 2 \times 10^3$. Compared to prior art magnetometer testing arrangements 26, 28, 30 such as those illustrated in FIGS. 2-4 described earlier, where equivalent cubic volume ratios are between $3 \times 10^4$ to $3 \times 10^8$, testing arrangement 40-1 employing socket 41-1 of FIGS. 5-7 can be volumetrically smaller than the prior art arrangements by at least one order of magnitude and typically by many orders of magnitude. This compactness is a great manufacturing convenience. Further, test socket 41-1 is relatively simple in design and construction and can be produced inexpensively to accommodate different body configurations of various magnetometers. In addition, it is simple to use and requires little training for high volume production operations. Still further, it substantially simplifies bringing each example or unit of magnetometer 20 being tested into substantially the same position with respect to the coils or other means for providing the applied magnetic field each time a unit is tested, calibrated and/or trimmed, so that errors associated with even small magnetic field non-uniformities are largely avoided. Yet another advantage of the foregoing testing arrangements is that they are extremely rugged. Magnetometer 20 is held firmly within rugged body 43-1 and magnetometer 20 can be subjected, for example, to large accelerations or temperature excursions without significant risk of damage and without magnetometer 20 having to be removed and placed in a different specially ruggedized test arrangement. Thus, when magnetometer 20 also contains, for example, acceleration and/or temperature and/or other sensors, magnetometer 20 can be tested for these functions as well as its magnetic field response without removing magnetometer 20 from test socket 41-1 of the type illustrated herein. Additionally the embodiments illustrated in FIGS. 5-7 (and 8-14) are: (i) adapted to function with existing pick & place (automated handling) equipment, (ii) use less power than the larger prior art arrangements of FIGS. 2-4, (iii) can provide a uniform field of controllable magnitude and direction, (iv) unlike many prior art arrangements, are less prone to mutual interference when placed near each other in a compact manufacturing environment, and (v) are less effected or influenced by nearby ferro-magnetic metal structures commonly found in a manufacturing environment. These are significant advantages. Testing arrangements 40-2 through 40-8 with test sockets 41-2 through 41-8 of FIGS. 8-14 provide substantially similar benefits compared to the prior art arrangements.

Figure 8:
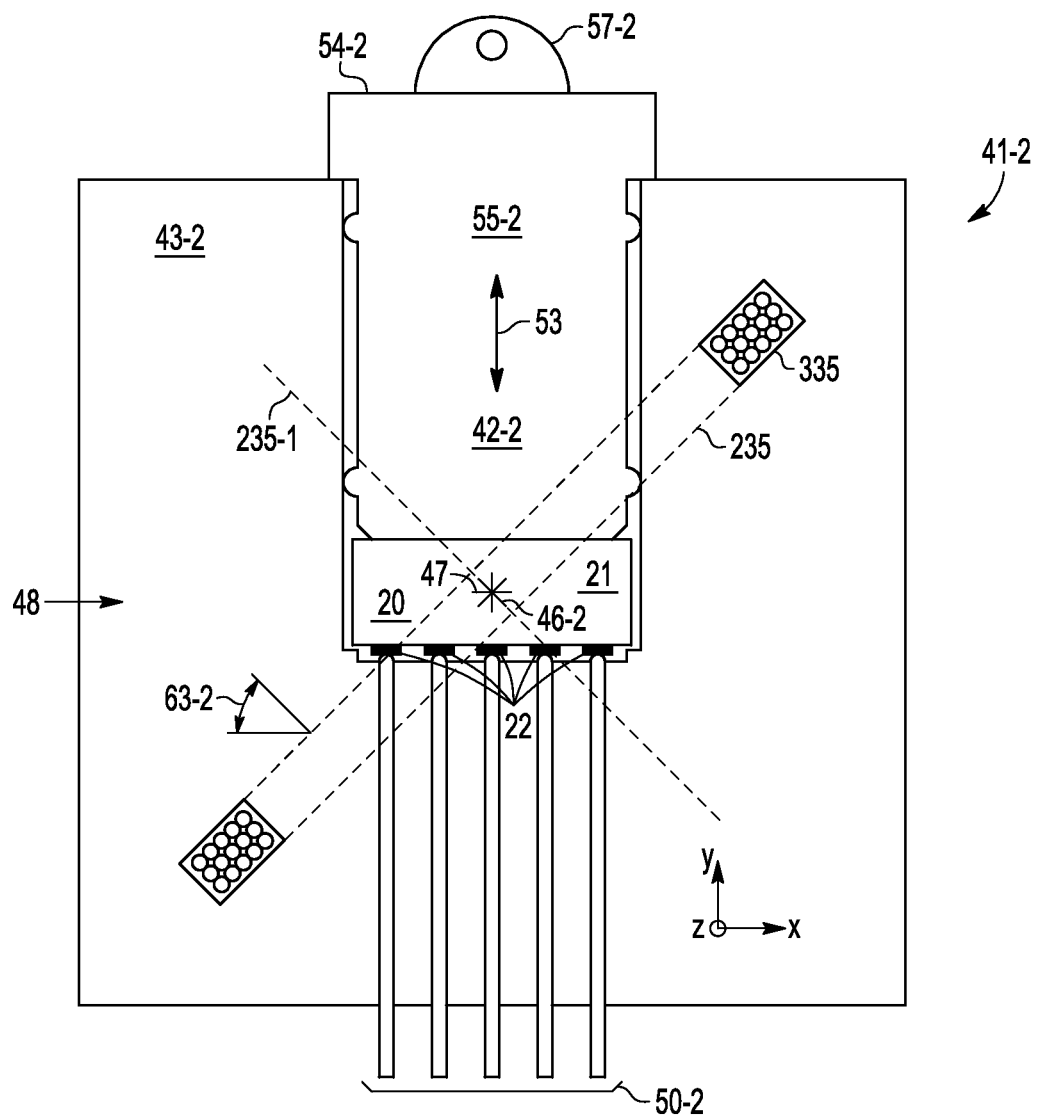
FIG. 8 shows a simplified cross-sectional view analogous to that of FIG. 7 but according to a further embodiment of the invention wherein a differently configured test socket is provided using a single electromagnetic coil for providing the test magnetic field.

FIG. 8 shows a simplified cross-sectional view of test arrangement 40-2 analogous to that of FIGS. 6-7, but according to a further embodiment of the invention wherein differently configured test socket 41-2 is provided using single electromagnetic coil 335 for generating the test magnetic field. Cap 54-2 with P&P coupling point 57-2 and extension or tang 55-2 adapted to move in directions 53 to hold magnetometer 20 in the desired position in cavity 42-2 are preferably included. Center point 46-2 of coil 335 is desirably located proximate magnetometer 20 and preferably proximate location 47 of the magnetic sensor(s) within magnetometer 20. In the illustration of FIG. 8, coil 335 is located at angle 63-2 in the x-y plane with respect to the principal face of magnetometer 20, but persons of skill in the art will understand that coil 335 can have any desired angle with respect to magnetometer 20 and can be rotated around any of axes x, y or z to achieve the desired orientation with respect to magnetometer 20. Coil 335 is desirably molded or otherwise solidly placed within body 43-2 of test socket 41-2, but other means for fixing the relative position of coil 335 and magnetometer 20 may also be used. The advantages described earlier for arrangement 40-1 with test socket 41-1 relative to the prior art arrangements of FIGS. 2-4 also apply generally to arrangement 40-2 with test socket 41-2.

Figure 9:
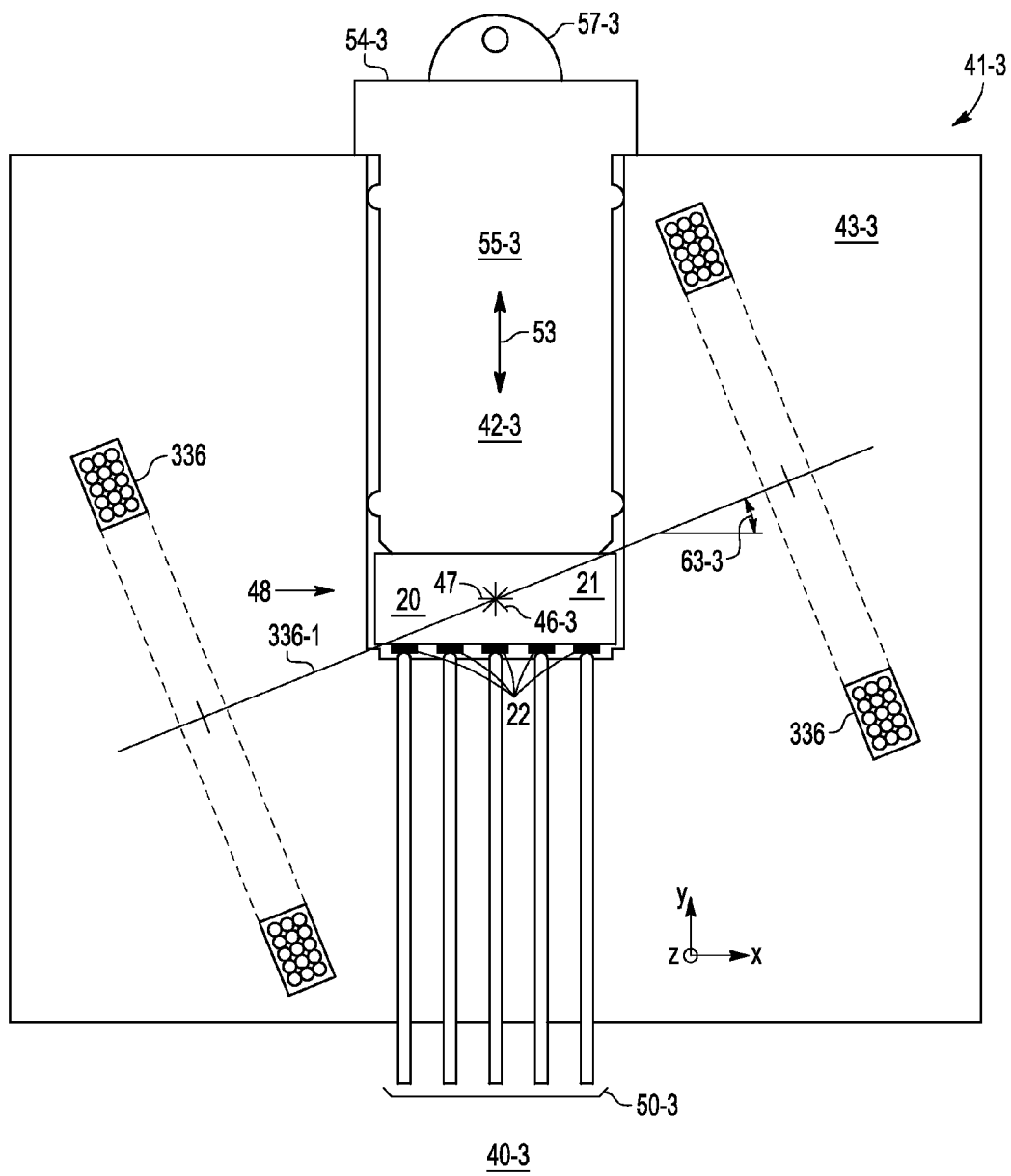
FIG. 9 shows a simplified cross-sectional view analogous to that of FIG. 8 but according to a still further embodiment of the invention wherein a differently configured test socket is provided using a single pair of electromagnetic coils analogous to those of FIG. 2 for providing the test magnetic field.

FIG. 9 shows a simplified cross-sectional view of test arrangement 40-3 analogous to that of FIG. 8 but according to a still further embodiment of the invention wherein differently configured test socket 41-3 is provided using a single pair of electromagnetic coils 336 analogous to coils 25 of FIG. 2 for providing the test magnetic field. Cap 54-3 with P&P coupling point 57-3 and extension or tang 55-3 adapted to move in directions 53 to hold magnetometer 20 in the desired position in cavity 42-3 during testing are preferably included. Center point 46-3 along common centerline 336-1 of coil pair 336 is desirably located proximate magnetometer 20 and preferably proximate location 47 of the magnetic sensor(s) within magnetometer 20. In the illustration of FIG. 9, centerline 336-1 of coil pair 336 is located at angle 63-3 in the x-y plane with respect to the principal face of magnetometer 20, but persons of skill in the art will understand that coil pair 336 can have any desired angle with respect to magnetometer 20 and can be rotated around any of axes x, y or z to achieve the desired orientation with respect to magnetometer 20. Coil pair 336 is desirably molded or otherwise solidly placed within body 43-3 of test socket 41-3, but other means for fixing the relative position of coil pair 336 and magnetometer 20 may also be used. The advantages described earlier for arrangement 40-1 with test socket 41-1 relative to the prior art arrangements of FIGS. 2-4 also apply generally to arrangement 40-3 with test socket 41-3.

Figure 10:
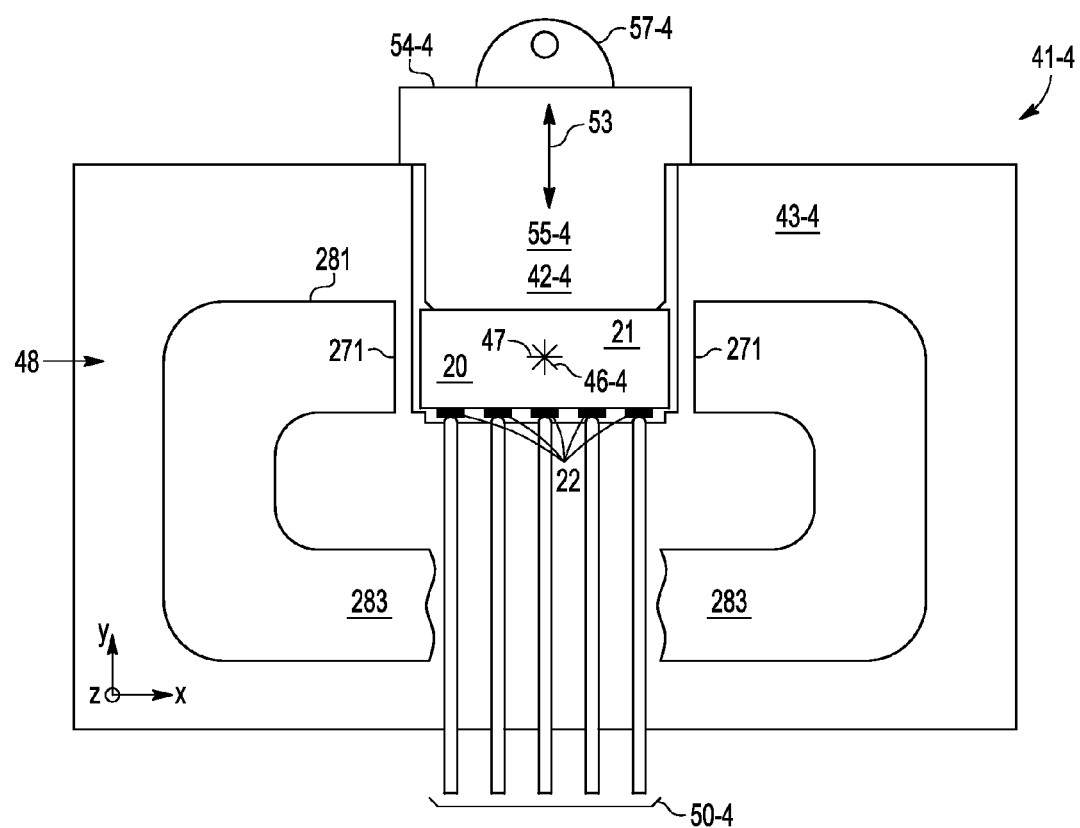
FIG. 10 shows a simplified cross-sectional view analogous to that of FIG. 8 but according to a yet further embodiment of the invention wherein a differently configured test socket is provided using a magnetic yoke analogous to that of FIG. 3 for providing the test magnetic field.

FIG. 10 shows a simplified cross-sectional view of test arrangement 40-4 analogous to that of FIG. 8 but according to a yet further embodiment of the invention wherein differently configured test socket 41-4 is provided using magnetic yoke or source 281 analogous to magnetic yoke 28 of FIG. 3 for providing the test magnetic field. Cap 54-4 with P&P coupling point 57-4 and extension or tang 55-4 adapted to move in directions 53 to hold magnetometer 20 in the desired position within cavity 42-4 are preferably included. Center point 46-4 between faces 271 of yoke 281 is desirably located proximate magnetometer 20 and preferably proximate location 47 of the magnetic sensor(s) within magnetometer 20. In the illustration of FIG. 10, yoke 281 is aligned approximately parallel to the principal face of magnetometer 20, but persons of skill in the art will understand that yoke or source 281 can have any desired angle with respect to magnetometer 20 and can be rotated around any of axes x, y or z to achieve the desired orientation with respect to magnetometer 20. Yoke or source 281 is desirably molded or otherwise solidly placed within body 43-4 of test socket 41-4, but other means for fixing the relative position of yoke or source 281 and magnetometer 20 may also be used. In the illustration of FIG. 10, yoke or source 281 has lower part 283 angled back behind the plane of FIG. 10 so that the central portion of lower part 283 and its energizing coil equivalent to coil 29 of FIG. 3 is located behind connection or test pins 50-4. To avoid unduly cluttering the drawings, the energizing coil is not shown in FIG. 10. In an additional embodiment, the energizing coil may be replaced by a permanent magnet. The earlier described advantages of test arrangement 40-1 with test socket 41-1 relative to the prior art arrangements of FIGS. 2-4 also apply generally to arrangement 40-4 with test socket 41-4.

Figure 11:
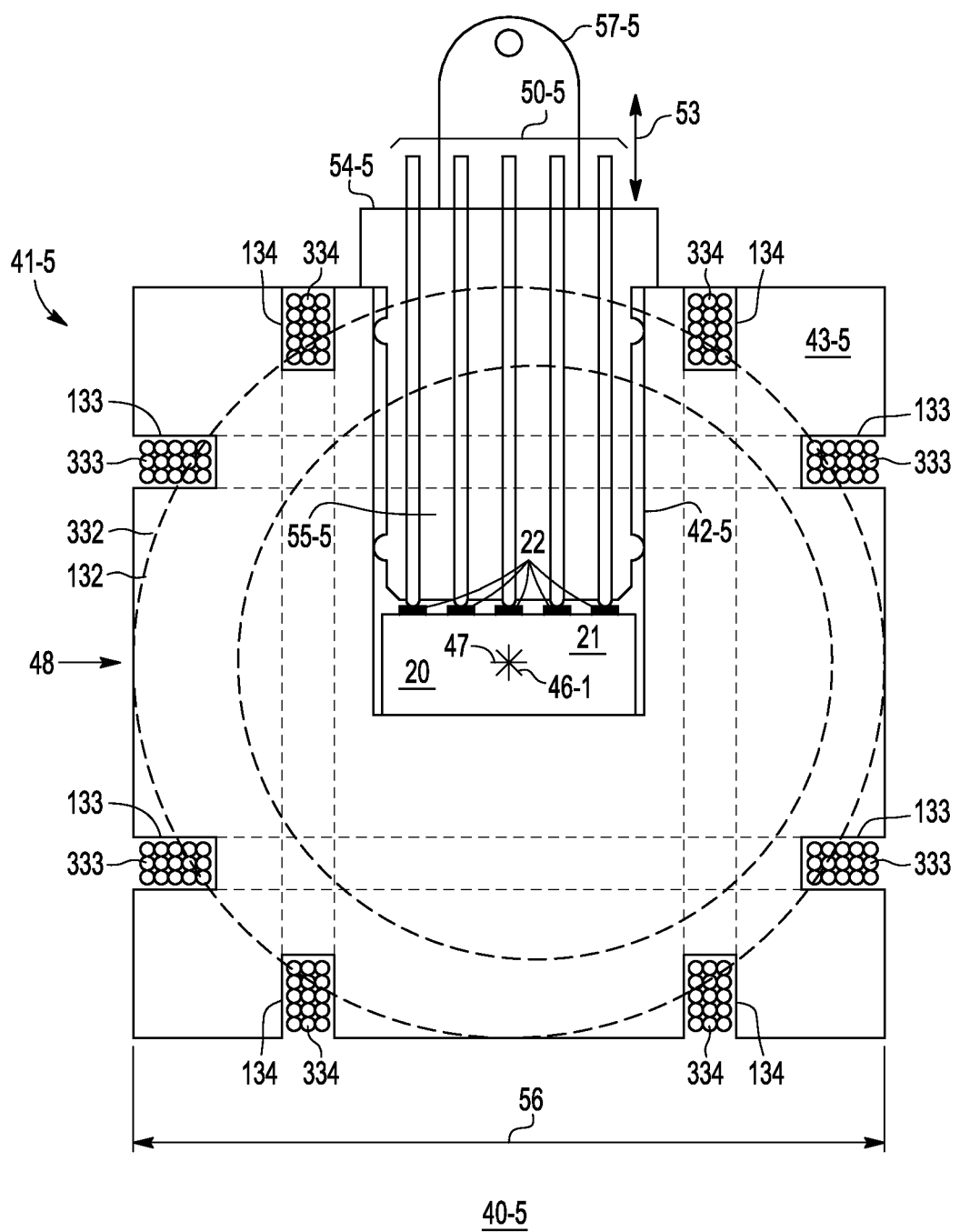
FIG. 11 shows a simplified cross-sectional view analogous to that of FIG. 7 but according to a still yet further embodiment of the invention wherein a differently configured test socket is provided wherein electrical connection to the magnetometer, is made through the cap of the test socket rather than through the body as in FIG. 7.

FIG. 11 shows a simplified cross-sectional view of test arrangement 40-5 analogous to that of FIG. 7 but according to a still yet further embodiment of the invention wherein somewhat differently configured test socket 41-5 is provided wherein electrical connection or test pins 50-5 to magnetometer 20 is made through cap 54-5 with P&P coupling point 57-2 and extension or tang 55-5 of test socket 41-5, rather than through body 43-5 that is otherwise analogous to body 43-1 in FIGS. 5-7. In other respects test socket 41-5 of FIG. 11 is substantially similar to test socket 41-1 of FIGS. 5-7, and the discussion of FIGS. 5-7 with respect to the test socket 41-1 is incorporated herein by reference. Test socket 41-5 has electrical connection or test pins 50-5 extending through cap 54-5 and extension or tang 55-5 into the interior of cavity 42-5 so as to connect with terminals 22 of magnetometer 20. In the embodiment of FIG. 11, magnetometer 20 is placed in cavity 42-5 with terminals 22 facing up, rather than facing down as illustrated in FIGS. 6-10. In other respects, it functions in the same way as previously described for test socket 41-1. Persons of skill in the art will also understand that the "contacts in the cap" configuration illustrated in FIG. 11 also applies to test sockets 41-2 through 41-4 and 41-6 through 41-8 illustrated elsewhere.

Figure 12:
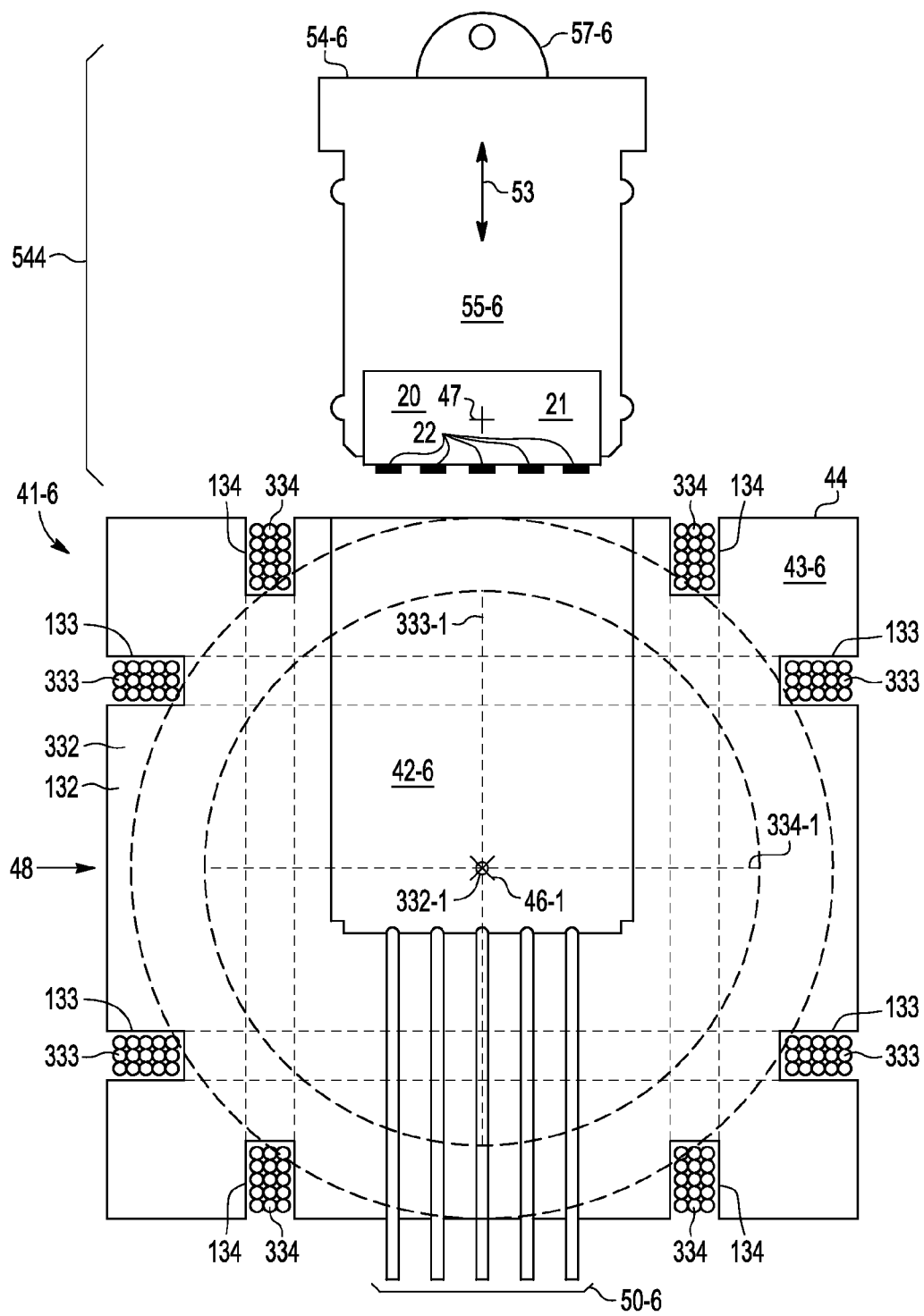
FIG. 12 shows a simplified cross-sectional view analogous to that of FIG. 7 but according to yet still further embodiment of the invention wherein a somewhat differently configured test socket is provided in which the magnetometer is initially placed in the test socket cap, and then the magnetometer-cap combination is inserted into the test socket cavity.

FIG. 12 shows a simplified exploded cross-sectional view of test arrangement 40-6 analogous to that of FIG. 6 but according to a yet still further embodiment of the invention wherein somewhat differently configured test socket 41-6 is provided wherein magnetometer 20 is initially placed in extension or tang 55-6 of test socket cap 54-6, and then combination 544 of cap 54-6 with magnetometer 20 held in tang or extension 55-6 is inserted into test socket cavity 42-6 of body 43-6 of test socket 41-6. P&P coupling point 57-6 is desirably but not essentially included in cap 54-6. When combination 544 is inserted into cavity 42-6, terminals 22 of magnetometer 20 come into contact with connection or test pins 50-6 in substantially the same manner as already described for connection or test pins 50-1 of test socket 45-1 of FIG. 7. Accordingly, the discussion of arrangement 40-1 with test socket 41-5 in connection with FIGS. 5-7 applies generally to arrangement 40-6 with test socket 41-6 of FIG. 12 and is, therefore, incorporated herein by reference. Persons of skill in the art will also understand based on the discussion herein, that the "contacts in the cap" configuration illustrated in FIG. 11 may be combined with the embodiment illustrated in FIG. 12 by moving connection or test pins 50-6 from body 43-6 to extension or tang 55-6 of cap 54-6. Either arrangement is useful.

Figure 13:
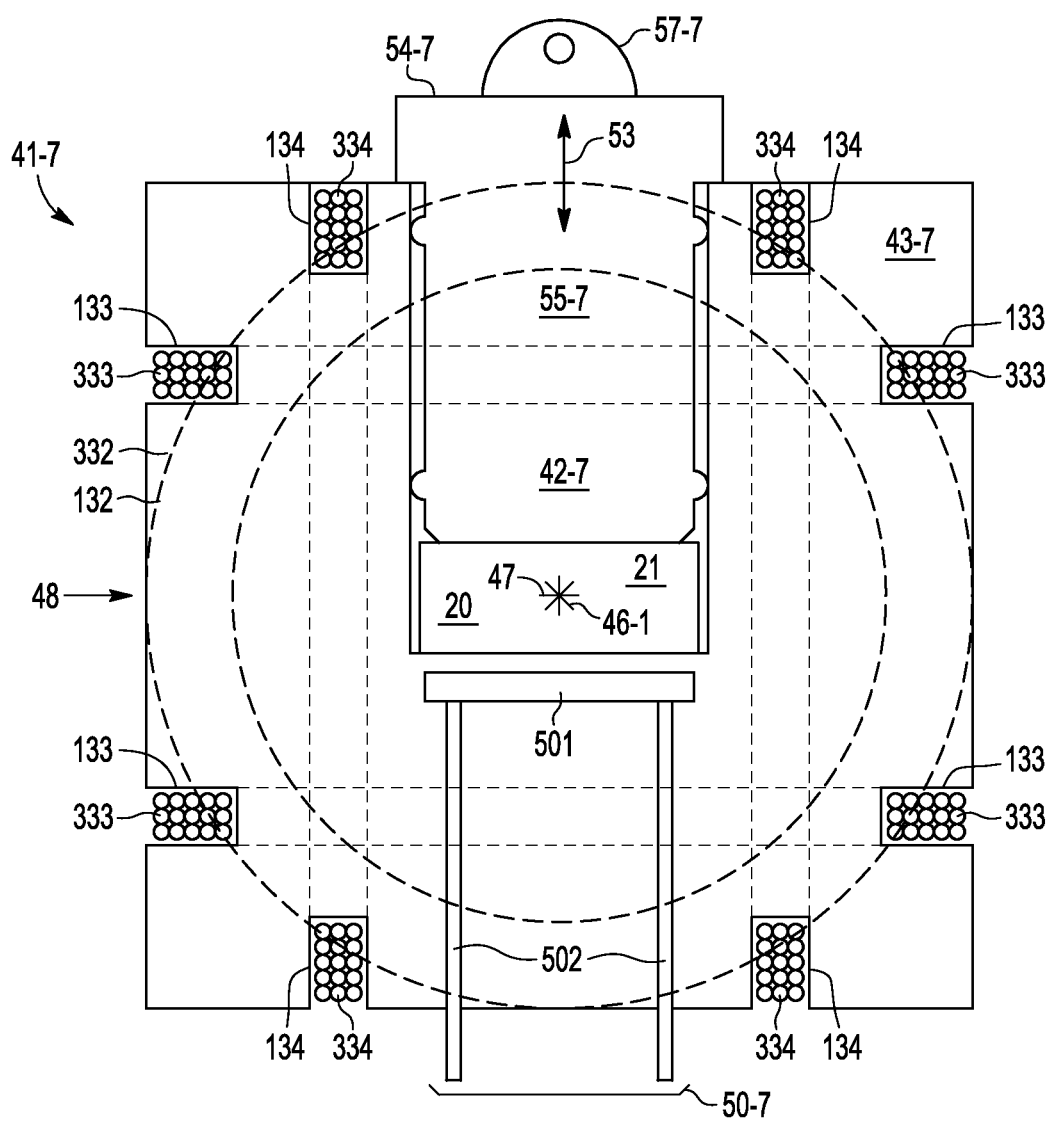
FIG. 13 shows a simplified exploded cross-sectional view analogous to that of FIG. 7 but according to another embodiment of the invention wherein a differently configured test socket is provided wherein electrical connection to the magnetometer is made using wireless means.

FIG. 13 shows a simplified cross-sectional view of test arrangement 40-7 analogous to that of FIG. 7 but according to a another embodiment of the invention wherein somewhat differently configured test socket 41-7 is provided, wherein electrical connection 50-7 to magnetometer 20 is made using wireless interface 501. Test socket 41-7 comprises body 43-7 having cavity 42-7 therein in much the same configuration as in sockets 41-1, 41-6, etc. However, instead of having connections 50-1 through 50-6 traversing body 43-7 or cap 54-7, electrical connection is made to magnetometer 20 by placing wireless interface 501 of connection 50-7 proximate magnetometer 20, that is, close enough for wireless communication with magnetometer 20. In this situation, magnetometer 20 also needs a wireless interface capability. Wireless interface technology is widely used, for example, in connection with radio frequency identification (RFID) tags, cell phones, and other two-way remotely addressable units (e.g., such as those employing the well known Bluetooth® protocol). In the example of FIG. 13, wireless interface 501 is shown located in body 43-7 close to a compatible wireless interface unit within magnetometer 20, but this is not essential and wireless interface 501 may also be located outside of body 43-7 or in other locations proximate magnetometer 20 where wireless communication with magnetometer 20 can occur. Magnetometer 20 is otherwise located substantially, proximate to centerline point 46-1. External leads 502 allow signals to be coupled into wireless interface 501 for energizing and transferring information to and from magnetometer 20. In yet other embodiments, wireless interface 501 and leads 502 may be placed in extension or tang 55-7 of cap 54-7 or wireless interface 501 and leads 502 may be located outside of body 43-7. Any of such arrangements are useful.

Figure 14:
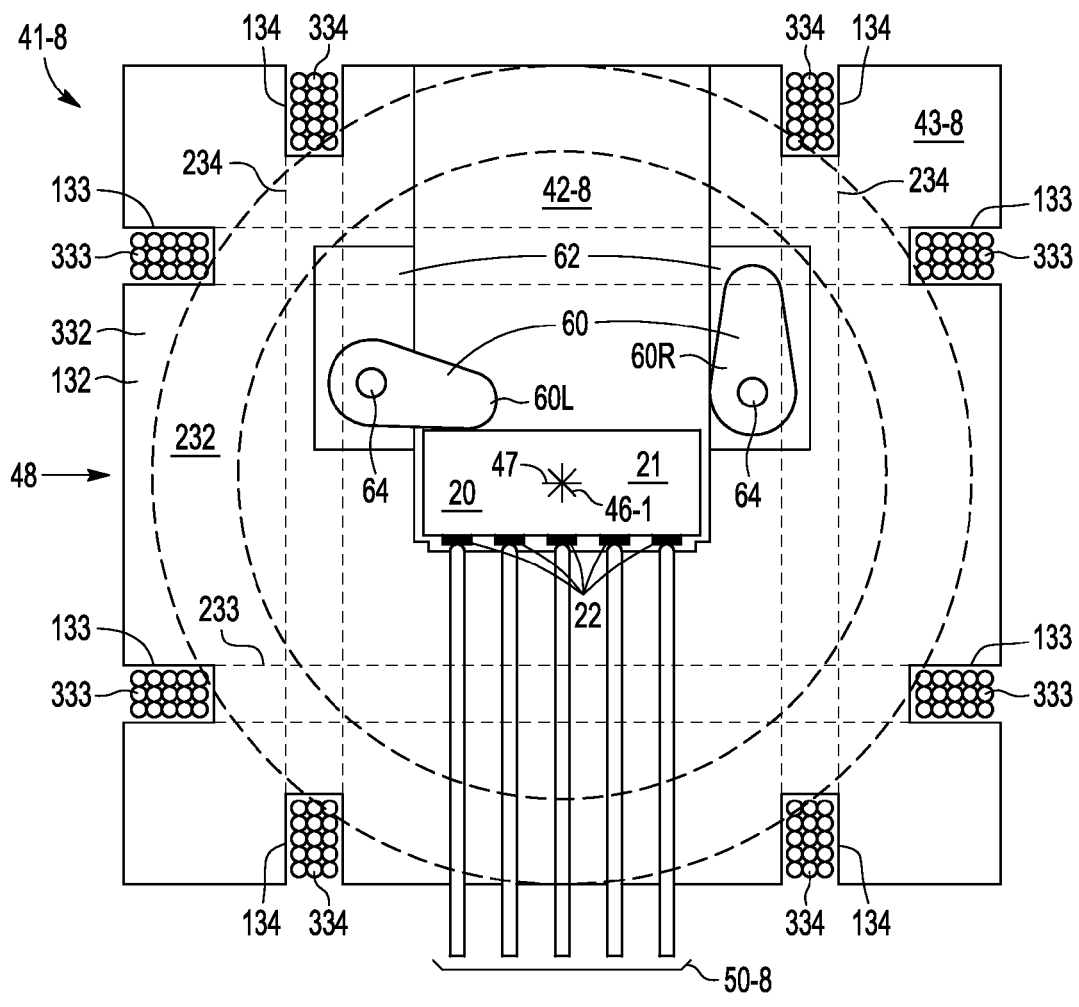
FIG. 14 shows a simplified cross-sectional view of a testing arrangement analogous to that of FIGS. 5-13, but according to still another embodiment of the invention wherein a differently configured test socket is provided having one or more cams therein for pressing the magnetometer against the electrical connections within the text socket.

FIG. 14 shows a simplified cross-sectional view of testing arrangement 40-8 analogous to that of FIGS. 5-13, but according to still another embodiment of the invention wherein differently configured test socket 41-8 is provided having therein one or more cams 60 for pressing terminals 22 of magnetometer 20 against electrical connections 50-8 within text socket 41-8. One or more cams 60 are rotatably mounted on axles or shafts 64 within subsidiary cavities 62, for example, in the sidewalls of principle cavity 42-8. In the illustration of FIG. 14, cam 60L on the left in FIG. 14 is shown rotated into the DOWN (pressing) position wherein it applies force on magnetometer 20 in the direction of connections or pins 50-8 so that terminals 22 of magnetometer 20 make good electrical contact with connections or pins 50-8. Cam 60R on the right in FIG. 14 is shown rotated into the UP (retracted) position so that it does not protrude into magnetometer cavity 42-8, thereby allowing magnetometer 20 to be freely inserted or removed from socket 41-8. Persons of skill in the art will understand that when it is desired to insert or remove magnetometer 20 that both of cams 60 are rotated into the UP position and, preferably, that when it is desired to insure good electrical contact between magnetometer terminals 22 and test connections or pins 50-8, both cams are desirably rotated into the DOWN position. Persons of skill in the art will also understand based on the description herein that one or more cams may be used and that cam(s) 60 may be rotated from outside of cavity 42-8 by, for example, fixing cam(s) 60 on axel(s) or shaft(s) 64 which extend through body 43-8 of socket 41-8 so as to be rotatable from outside of body 43-8, thereby causing cam(s) 60 to rotate in response to twisting or rotating shafts or axels 64.

Test arrangements 40-1 through 40-8 described above are collectively referred to as test arrangements 40. Similarly: (1) test sockets 41-1 through 41-8 are collectively referred to as test sockets 41; (2) test socket bodies 43-1 through 43-8 are collectively referred to as test socket bodies 43; (3) test socket body cavities 42-1 through 42-8 are collectively referred to as test socket body cavities 42; (4) test socket caps 54-1 through 54-7 are collectively referred to as test socket caps 54; (5) test socket extensions or tangs 55-1 through 55-7 in the foregoing are collectively referred to as test socket extensions or tangs 55; and (6) coupling or connection points 57-1 through 57-7 are referred to collectively as connection points 57. It should also be understood with arrangements 40 and sockets 41 that socket caps 54 may be omitted and extensions or tangs 55 provided without caps 54. Connection points 55 on extensions or tangs 55 may be attached to any other element (e.g., part of an automatic P & P handling machine—not shown) to facilitate insertion and removal of magnetometer 20 into and from socket 41. Further, while extension or tang 55 is convenient for insuring that terminals 22 of magnetometer 20 are in reliable contact with external connection or test pins 50, any other means of accomplishing this function may also be used. Non-limiting examples of alternative arrangements for insuring that magnetometer 20 is seated within zone 48 of socket 40 with terminals 22 touching electrical connection or test pins 50 are: (1) an inflatable bag(s) or chamber(s), for example mounted in the walls of cavity 42, that expands within cavity 42 after magnetometer 20 is inserted in cavity 42 so as to press terminals 22 of magnetometer 20 against external electrical connection or test pins 50, or (2) one or more levers or cams such as are illustrated in FIG. 14 that may be stored in the walls of cavity 42 and that flip down as or after magnetometer 20 is inserted in cavity 42 to press terminals 22 of magnetometer 20 against electrical connection or test pins 50, or any other element(s) that are retracted when magnetometer 20 is being inserted or removed from cavity 42 and that press on magnetometer 20 to push terminals 22 of magnetometer 20 against electrical connection or test pins 50. Accordingly, extension or tang 55, cam(s) 60, and their equivalents may be more generally referred to as pressing elements 55, 60, and the term "pressing element" is intended to include any way of holding magnetometer 20 in zone 48 within test socket 41 during testing so that terminals 22 of magnetometer 20 and/or any wireless communication interface within magnetometer 20 are in electrical communication with connection or test pins 50 of test socket 41.

Although coil pairs or coils 332, 333, 334, 335, 336 are shown in connection with arrangements 40 and sockets 41, the current carrying leads needed to energize these and other coils have been omitted in FIGS. 5-14 in order to avoid unduly cluttering the drawings and obscuring embodiments of the invention. However, such current carrying leads to the various coils used to generate the test magnetic fields are indicated schematically by link or bus 408-1 of FIG. 15.

Figure 15:
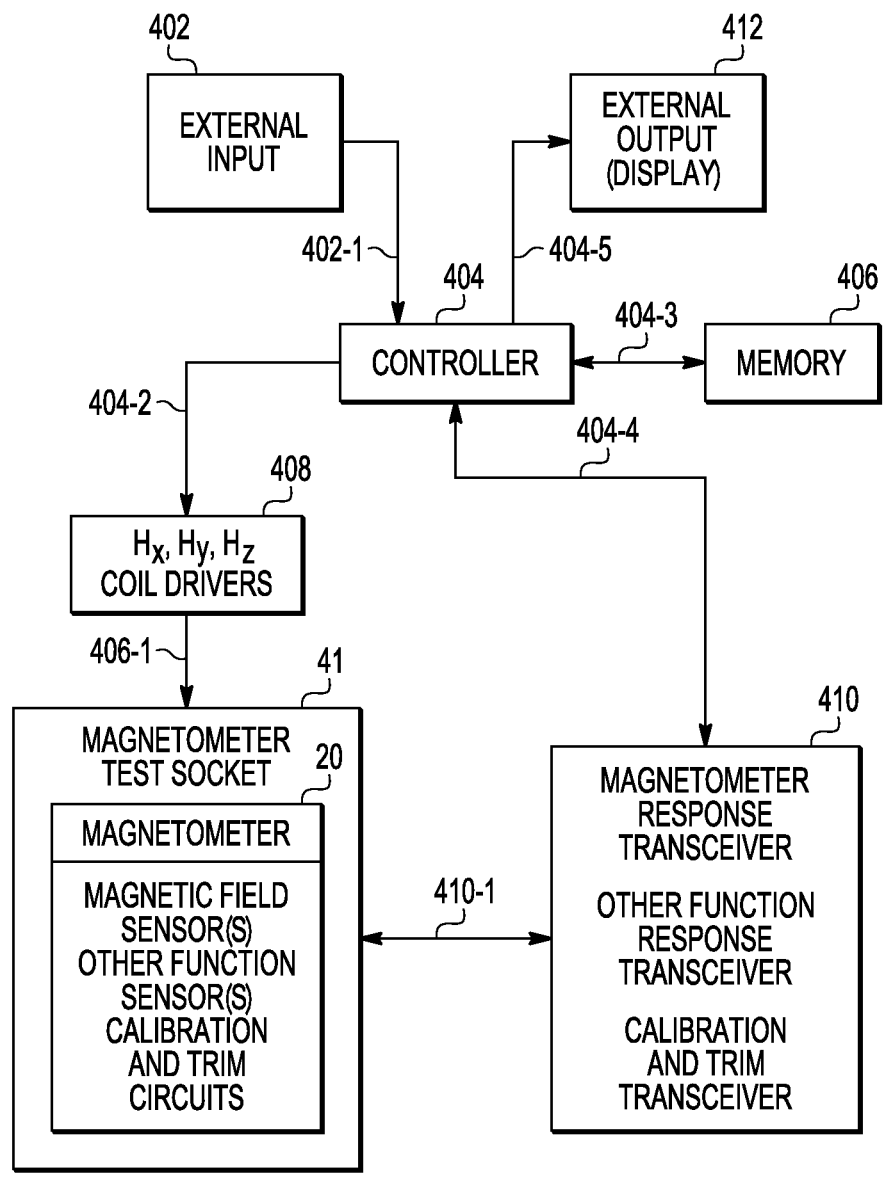
FIG. 15 shows a simplified schematic block diagram of an electrical portion of the test arrangements illustrated in FIGS. 5-14 according to yet another embodiment of the invention.

FIG. 15 shows simplified schematic block diagram 400 of an electrical portion of test arrangements 40 illustrated in FIGS. 5-14, according to a still yet further embodiment of the invention. Electrical portion 400 comprises external input 402 coupled via bus or link 402-1 to controller 404. Controller 404 is coupled by bus or link 404-2 to drivers 408 for supplying current to the various coils that produce magnetic fields Hx, Hy, Hz. Coil drivers 408 are coupled via bus or link 408-1 to the magnetic field producing coil or coils (e.g., yoke or coils 281, 332, 333, 334, 335, 336) within magnetometer test socket 41, as have been illustrated for example in FIGS. 5-14. Within magnetometer test socket 41 is magnetometer 20, various magnetic field sensor(s) and, in some cases other functions as well as calibration and trim circuitry associated with the magnetic sensor(s) and other functions (e.g., accelerometers, temperature gages, etc.). Controller 404 is also coupled by bus or link 404-4 to magnetometer response transceiver 410 which may also contain receivers for other functions as noted above and calibration, trim setting and other circuitry. Magnetometer response transceiver 410 receives responses from magnetometer 20 and sends them on to controller 404 and receives calibration, trimming and other instructions from controller 404 which it then passes on to magnetometer test socket 41 and magnetometer 20. Magnetometer response receiver 410 and magnetometer test socket 41 are coupled by bus or link 410-1. Controller 404 is also coupled by bus or link 404-3 to memory 406. Memory 406 may contain both transient memory for use during various operations as well as permanent or semi-permanent memory for storing various program instructions and for longer term data storage. Controller 404 is coupled via bus or link 404-5 to external output 412, as for example but not intended to be limiting, a display on which the status of magnetometer 20 and/or the various test functions being performed may be displayed as well as the test results. However, external output 412 is not limited merely to a display and may included means for recording and/or transmitting test result data and other information to other manufacturing operations, as well as to production control operations, customer service operations, data logging equipment or services, and other business functions.

FIGS. 16 and 17 show simplified method 600 for testing, calibrating and/or trimming magnetometer 20 and other functions that may be included therein (e.g., accelerometers, etc.), using test arrangements 40 comprising test sockets 41, for example, of the type illustrated in FIGS. 5-14 and electrical portion 400 of FIG. 14, according to additional embodiments of the invention. Referring now to FIG. 16, method 600 begins with START 601 and initial step 602 wherein magnetometer 20 is provided and installed in test socket 41 of any of the types illustrated in FIGS. 5-14 and variations thereon. To reduce the clutter in FIGS. 16 and 17, the abbreviation "MAG." is used for the word "magnetometer". In step 604, the magnetic field applied to magnetometer 20 in test socket 41 is set to zero. This may be accomplished for example, by setting the drive current supplied by coil driver 408 (see FIG. 15) to yoke or coils 281, 332, 333, 334, 335 and/or 336 to zero, or if there is a significant background magnetic field in the test area that might affect the "zero H field" reading of the magnetic sensors within magnetometer 20, then controller 404 can arrange to have coil driver 408 energize yoke or coils 281, 332, 333, 334, 335 and/or 336 to provide an equal and opposite field to the background field so that the net field at the location of magnetometer 20 is effectively zero. Either arrangement is useful depending upon the circumstances.

Continuing to refer to FIG. 16, in step 606, in an exemplary embodiment, magnetometer 20 under test is queried by magnetometer response transceiver 410 to determine the response of magnetometer 20 to a "zero field" condition. In logical query step 608 of method 600, controller 404 of electrical system 400 determines whether the response received from magnetometer 20 during the "zero field" test corresponds to the expected response stored in memory 406. For example, if the output of magnetometer 20 corresponds to a "H≠0" output, then logical query 608 directs method along path 609-1 to loop limiting query step 610 wherein it is determined whether or not method 600 has made a corrective loop (e.g., 606, 608, 610, 612, 606, etc.) more than M times, where M is a number selected by, for example, the test engineer or other person supervising the test procedure. The purpose of query 610 is to interrupt the testing process if for some reason corrective loop 606, 608, 610, 612, 606, etc., does not result in a unit with a correct zero field response. If the outcome of query 610 is "YES" indicating that the allowed number of loops has been reached then method 600 proceeds via path 611-2 to step 630 where magnetometer 20 under test is identified as a "FAILED" unit. Then method 600 proceeds along path 631 as further illustrated in FIG. 17.

If the outcome of loop limiting query 610 is "NO" indicating that the corrective loop limit M has not yet been reached, then method 600 advances via path 611-1 to step 612, wherein the H=0 response of magnetometer is optionally trimmed, calibrated or otherwise adjusted (e.g., SET H=0 POINT). Method 600 then returns to step 606 where the response of magnetometer 20 to H=0 test condition is re-determined and in query 608 again compared with the expected response from memory 406. This loop 606, 608, 610, 612, 606, etc., is repeated until either loop limit M is exceeded (e.g., unit has FAILED) or the response of magnetometer 20 to an H=0 test condition corresponds to the expected response, which is indicated in query 608 as being "RESPONSE=0", that is, corresponding to the expected output for H=0. This indicates that magnetometer 20 has been successfully calibrated for H=0 and/or has successfully passed the H=0 test or both. While the H=0 test, trim and/or calibration steps explained above are desirable, they are not essential and in still further embodiments they may omitted or an H=0 test accomplished in other ways, as for example but not intended to be limiting, by averaging the responses from H=+H1 and H=−H1 tests described below. Method 600 is intended to accommodate such variations.

Still referring to FIG. 16, method 600 then advances to step 614 wherein as directed by controller 404, coil driver 408 provides predetermined currents to the various coils or coil pairs or yoke (e.g., 281, 332, 333, 334, 335, and/or 336) of test socket 41 so as to expose magnetometer 20 to a predetermined magnetic field H of magnitude and direction H=+H1, keeping in mind that +H1 may include components in any or all magnetic directions and magnitudes, e.g., +Hx, +Hy, +Hz. This is especially relevant in the arrangement illustrated by test sockets 41-1 and 40-5 through 40-8 wherein three substantially orthogonal coils 332, 333, 334 are provided, which when receiving currents Ix, Iy, Iz can provide any and all magnetic vectors +Hx, +Hy, +Hz, so that resulting magnetic field +H1 has the desired direction and magnitude. In step 616, the response of magnetometer 20 to magnetic field H=+H1 is measured via transceiver 410 and controller 404, and in step 618 temporarily stored in memory 406 for future use.

In step 620 of method 600, as directed by controller 404, coil driver 408 desirably provides predetermined currents to the various coils or coil pairs or yoke (e.g., 281, 332, 333, 334, 335, and/or 336) of test socket 41 so as to expose magnetometer 20 to a predetermined magnetic field H of magnitude and direction H=−H2, keeping in mind that −H2 may include components in any or all magnetic directions and magnitudes, e.g., −Hx, −Hy, −Hz. In a preferred embodiment, +H1 and −H2 desirably have different magnetic directions, as indicated by the + and − signs accompanying them, but this is not essential and H1 and H2 may have the same or different magnetic directions and/or magnitudes. Either arrangement is useful. In step 624, the response of magnetometer 20 to magnetic field H=−H2 is measured via transceiver 410 and controller 404, and in step 622 temporarily stored in memory 406 for future use. In logical query 626, controller 404 determines if the responses of magnetometer 20 to the +H1 and −H2 applied magnetic field tests received via transceiver 410 correspond to the expected responses stored in memory 406, where "H1 & H2 RESPONSES=SPEC." corresponds to a logical "YES" (i.e., meets the desired specification) and "H1 & H2 RESPONSES SPEC." corresponds to a logical "NO", that is, does not meet the desired specification. Persons of skill in the art will understand that "H1 & H2 RESPONSES SPEC." also includes the situation where either of H1 or H2 responses fails to correspond to the stored specification value(s).

If the outcome of query 626 is "YES" then the unit is magnetically "GOOD" and method 600 advances via path 627-1 to step 636 in FIG. 17. If the outcome of query 626 is "NO", indicating that the unit under test failed the test, then method 600 advances via path 627-2 to further logical query 628 wherein it is determined whether or not to merely reject the unit (e.g., follow path 629-1 to "IDENTIFY AS FAILED" step 630 and path 631 to "REMOVE MAG. FROM TEST SOCKET" step 670 of FIG. 17), or to attempt to trim or calibrate the unit to provide the desired response when exposed to calibrating fields, e.g., +H1 and/or −H2. Whether or not to reject or trim may be pre-determined by the test engineer or other person supervising the test procedure. If the outcome of query 628 is "TRIM" than as shown by path 629-2 method 600 advances to adjustment step 632 wherein using the stored responses received via transceiver 410, controller 404 calculates an adjustment intended to have the magnetometer's response more closely match the specified response when subjected to magnetic fields H=+H1 and/or −H2, and causes transceiver 410 to send such settings or changes in settings back to magnetometer 20 via link or bus 410-1 (see FIG. 15). Method 600 desirably but not essentially proceeds to loop limiting step 634, whose operation is similar to that of step 610. If loop limit N is not exceeded, then method 600 proceeds via path 635-2 to step 614 already described and loop 614, 616, 618, 620, 622, 624, 626, 628, 632, 634 is repeated until either loop limit N is exceeded (YES outcome) whereupon method 600 proceeds via path 635-1 to ("IDENTIFY AS FAILED") step 630 and following, or if the outcome ("H1 & H2 RESPONSES=SPEC.") of query 626 indicates that the magnetometer response matches the stored specifications and the unit passed the tests, then method 600 advances via path 627-1 to step 636 of FIG. 17. Loop limiting step 634 and adjustment step 632 may be performed in either order. While method 600 illustrates the use of H=0 as well as +H and −H applied field tests, this is not essential and, depending upon the characteristics of magnetometer 20 being tested, one or more of H=0 and/or +H and/or −H tests may be performed or several of +H and/or −H tests may be performed with different magnetic directions and/or magnitudes, as determined by the test engineer or user. Method 600 is intended to accommodate such variations.

In a further embodiment, the magnetometer trimming operation is performed in two stages: (i) a coarse correction stage, and (ii) a fine correction stage. The coarse correction stage comprises: establishing a predetermined test magnetic field H (e.g., H=0, and/or H=+H1, and/or H=−H2, etc.) through magnetometer 20, measuring the response of magnetometer 20 thereto and comparing it to the stored expected value, and when it does not substantially match the expected value, calculating a coarse correction parameter, sending the coarse correction parameter to the magnetometer to alter its response to the test magnetic field H, and re-measuring and comparing the re-measured value to the expected value. The fine correction stage comprises, calculating a fine correction parameter using the re-measured value, sending the fine correction parameter to magnetometer 20, exposing the magnetometer to a predetermined test magnetic field H that may be the same or different than previously used, measuring the re-measured response of magnetometer 20 thereto and comparing it to the stored expected value. This two stage (coarse adjustment then fine adjustment) may be performed for any of the desired magnetometer parameters, including its response to non-magnetic stimuli as discussed later.

Referring now to FIG. 17, those units that have failed the above-described tests are proceeding via path 631 to "REMOVE MAG. FROM TEST SOCKET" step 670 and thence to END 672. Those units that have passed the various magnetic tests described in connection with FIGS. 15-16 proceed along path 627-1 from FIG. 16 to logical query step 636 of FIG. 17, wherein it is determined whether or not other tests need to be performed on magnetometer 20, in this example, query 636 corresponds to "ACCELERATION TEST NEEDED?". It will be understood that "ACCELERATION" is merely exemplary and not limiting and that any other type of test may be substituted for the described acceleration tests. In general, such other tests may be described as subjecting the magnetometer to other energy sources besides the above-described magnetic field sources. If the outcome of query 636 is "NO" indicating that no other type of test is needed, then method 600 proceeds via path 637-1 to step 670, where the device is removed from test socket 41 and, since it has passed prior tests, is sorted as a "GOOD" unit.

If the outcome of query 636 is YES indicating that other tests are needed, then method 600 proceeds via path 637-2 to step 638 where the environmental parameter being tested is set to an appropriate reference value. In the case of acceleration A, then A=0 is convenient. In the case of other functions or environmental variables that need to be tested, the condition to which magnetometer 20 will be exposed, is set to some convenient reference value determined by the magnetometer user or designer. In step 640, the response of magnetometer 20 to the assigned environmental condition (e.g., A=0) is measured, e.g., via transceiver 410, and reported to controller 404 and in query step 642 it is determined whether or not the response corresponds to the predicted value retrieved by controller 404 from memory 406. In the case of A=0, the expected response from an accelerometer located within magnetometer 20 is also conveniently but not essentially zero, so that "RESPONSE=0" or equivalent indicates that the unit has passed this test (i.e., unit is, so far, GOOD) and "RESPONSE 4" or equivalent indicates "FAIL". A "FAIL" response can indicate that the unit is defective or that it has not yet been appropriately calibrated or trimmed. For a "FAIL" output of query 642, method 600 proceeds via path 643-1 to loop limiting step 644, similar in function to other loop limiting steps previously discussed. If the outcome of query 644 is "YES" that is, more than P loops have occurred (e.g., the unit could not be calibrated), then as indicated by path 645-2 method 600 proceeds to "IDENTIFY AS FAILED" step 664 and thence to "REMOVE MAG. FROM TEST SOCKET" step 670 and then to END 672, where the unit can be sorted with those that have "FAILED" a test. If the outcome of query 644 is "NO" indicating the loop limit of P loops has not been exceeded, then as indicated by path 645-1, method 600 proceeds to step 646 where the, e.g., accelerometer A=0 test condition response error is evaluated and a correction calculated by controller 404 and sent to magnetometer 20 via transceiver 410. Method 600 then returns to SET A=0 CONDITION step 638 and the response of magnetometer 20 is measured again in step 640 and compared in query 642 to determine whether the adjustment has been successful. The loop 638, 640, 642, 644, 646, 638, etc. can be repeated until P is exceeded or the outcome of query 642 is "RESPONSE=0 (or whatever other reference point has been chosen) indicating that the unit has passed this test. While the A=0 test, trim and/or calibration steps explained above are desirable, they are not essential and in still further embodiments they may omitted or an A=0 test accomplished in other ways, as for example but not intended to be limiting, by averaging the responses from A=+A1 and A=−A1 tests described below. Method 600 is intended to accommodate such variations.

When an A=0 test has been performed and the outcome of query 642 is "RESPONSE=0" (or equivalent) indicating that the unit has passed this test (or the test has been omitted or otherwise accomplished), method 600 proceeds to steps 648, 650, 652, 654, 656, 658 and query 660, analogous to steps 614, 616, 618, 620, 622, 624 and query 626 during magnetic testing of magnetometer, but in this case, magnetometer 20 is being subjected to various inputs relating to the function currently under test, e.g., acceleration. In the case of a built-in accelerometer function, acceleration A is set to, for example, various values A=+A1 and/or −A2 (see steps 648, 654), the responses of magnetometer 20 to such stimuli measured (steps 650, 656) and temporarily stored (steps 652, 658), then compared (step 660) to the expected responses and a calibration or trim curve calculated and an adjusted calibration fed back (step 666) to the accelerometer circuitry on board magnetometer 20 in generally the same manner as for the magnetic response calibration procedures described earlier. The loop 648, 650, 652, 654, 656, 658, 660, 662, 666, 668 and along path 669-1 back to step 648 may be followed as long as loop limit Q has not been exceeded or until "A1 & A2 RESPONSES=SPEC." (e.g., the unit is properly calibrated or trimmed) is obtained, and along path 661-1 to "REMOVE MAG. FROM TEST SOCKET" step 670 and then to END 672 where the unit may be classified as a GOOD unit. If loop limit Q in query 668 is exceeded, then it has not been possible to calibrate or trim the unit and method 600 proceeds as shown by path 669-2 to "IDENTIFY AS FAILED" step 664, then to "REMOVE MAG. FROM TEST SOCKET" step 670 and then to END 672 where the unit may be classified as a "FAILED" unit. These tests may all be performed without removing magnetometer 20 from test socket 41, although using more than one test socket is not precluded even though less economical. For convenience of description, a magnetometer that has not yet passed various tests may be identified herein as magnetometer 20, and a unit that has passed various tests may be identified as magnetometer 20'. While method 600 illustrates the use of, for example, A=0 as well as +A and/or −A tests, this is not essential and, depending upon the characteristics of magnetometer 20 being tested, one or more of A=0 and/or +A and/or −A tests (or equivalent parameter) may be performed or several of +A and/or −A tests may be performed with different directions and/or magnitudes, as determined by the test engineer or user. Accordingly, method 600 is intended to accommodate such variations.

According to a first embodiment, there is provided a test socket (41) for a magnetometer (20), comprising, a substantially rigid body (43) having therein a cavity (42) adapted to receive the magnetometer (20) in a predetermined position

(48) within the body (43), one or more magnetic field sources (281, 332, 333, 334, 335, 336) adapted to provide a magnetic field passing through the predetermined position (48), electrical connection (50) within or proximate the test socket (41) for temporary electrical coupling to the magnetometer (20) during testing, and a pressing element (55, 60) adapted to fit into the cavity (42) to hold the magnetometer (20) in the predetermined position (48) electrically coupled to the electrical connection (50). According to a further embodiment, the one or more magnetic field sources (281, 332, 333, 334, 335, 336) comprise one or more electrical coils (332, 333, 334, 335, 336) each having a centerline (e.g., 332-1, 333-1, 334-1, 335-1, 336-1) passing substantially through the predetermined position (48). According to a still further embodiment, the one or more magnetic field sources (281, 332, 333, 334, 335, 336) comprise three substantially mutually orthogonal electrical coil pairs (332, 333, 334), wherein each coil pair (332, 333, 334) has a centerline (332-1, 333-1, 334-1) passing substantially through the predetermined position (48). According to a yet further embodiment, the centerlines (332-1, 333-1, 334-1) pass substantially through a common point (46) located within the predetermined position (48). According to a till yet further embodiment, the one or more magnetic field sources (281, 332, 333, 334, 335, 336) are substantially fixedly held by the substantially rigid body (43) in predetermined relationship to the predetermined position (48). According to a yet still further embodiment, the magnetometer (20) is temporarily attached to the pressing element (55) when inserted into the test socket (41). According to another embodiment, the electrical connection (50) to the magnetometer (20) is held by the pressing element (55). According to a still another embodiment, magnetometer (20) has an exterior volume $V_{MAG}$ and the test socket (41) has an exterior volume $V_{TS}$ and a ratio $V_{TS}/V_{MAG}$ is less than $2.8 \times 10^4$.

According to a second embodiment, there is provided a method (600) for manufacturing a magnetometer (20), comprising, installing the magnetometer (20) in a predetermined position (48) in a test socket (41), wherein the test socket comprises a substantially rigid body (43) with a cavity (42) therein adapted to receive the magnetometer (20) in the predetermined position (48) within the cavity (42), one or more magnetic field sources (281, 332, 333, 334, 335, 336) fixedly held by the substantially rigid body (43) in predetermined relation to the predetermined position (48) and adapted to provide a magnetic field passing through the predetermined position (48), and electrical connection (50) adapted to provide electrically coupling to the magnetometer (20) during testing, holding the magnetometer (20) in the predetermined position (48) in cooperative contact or communication with the electrical connection (50) during testing, using the one or more magnetic field sources (281, 332, 333, 334, 335, 336), creating a magnetic field H in the predetermined position (48) passing through the magnetometer (20), using the electrical connection (50), measuring a response of the magnetometer (20) to the magnetic field H, comparing the measured response to a stored expected value of the response to asses whether the magnetometer (20) provided an expected value of the response, and removing the magnetometer (20) from the test socket (41). According to a further embodiment, the holding step is performed using a pressing element (55, 60) within the cavity (42). According to a still further embodiment, the pressing element (55, 60) is retracted when the magnetometer (20) is being removed from the cavity (42). According to a yet further embodiment, if the magnetometer (20) did not provide an expected value, the method (600) further comprises, using the measured response to calculate a trimming or calibrating parameter intended to correct the measured response to more closely match the expected value, sending the trimming or calibrating parameter to the magnetometer (20), and repeating the creating, measuring, and comparing steps to assess a result thereof. According to a still yet further embodiment, the steps comprising calculating a trimming or calibrating parameter, sending it to the magnetometer (20), and comparing and assessing the results thereof, comprises at least, (i) a coarse trim or calibration and assessment operation, and (ii) a fine trim or calibration and assessment operation. According to a yet still further embodiment, the step of creating a magnetic field H in the predetermined position, comprises creating a magnetic field having at least two predetermined values. According to another embodiment, the method further comprises subjecting the magnetometer (20) in the same or a substantially similar test socket (41) to a test using a non-magnetic stimulus, measuring a response thereto and comparing it to an expected non-magnetic stimulus response value. According to a still another embodiment, the method still further comprises using the first response, obtaining and sending a first non-magnetic trimming or calibrating signal to the magnetometer (20) to alter its response to the non-magnetic stimulus, performing a further test using a non-magnetic stimulus, determining a further response thereto and comparing it to another expected non-magnetic stimulus response value. According to a yet another embodiment, the magnetometer (20) has an exterior volume $V_{MAG}$ and the test socket (41) has an exterior volume $V_{TS}$ and a ratio $V_{TS}/V_{MAG}$ is less than $2.8 \times 10^4$.

According to a third embodiment, there is provided a method for manufacturing a magnetometer unit (20), comprising, inserting a magnetometer unit (20) in a test socket (41) having a substantially rigid body (43) with a cavity (42) therein for holding the unit (20) in a predetermined position (48) proximate electrical connection (50) thereto and one or more magnetic field sources (281, 332, 333, 334, 335, 336) fixed in the body (43) to provide a known magnetic field H at the position (48), using the one or more magnetic field sources (281, 332, 333, 334, 335, 336) fixed in the body (43), exposing the untested magnetometer unit (20) to the known magnetic field H, using the electrical connection (50), measuring a response of the magnetometer unit (20) to the magnetic field H, determining any difference between the measured response and a stored expected response to the magnetic field H, using such difference, calculating a trimming parameter adapted to alter the response of the magnetometer unit (20) to reduce the magnitude of the difference, performing a trimming operation by sending the trimming parameter to the magnetometer unit (20) using the electrical connection (50), and assessing the success of the trimming operation by repeating the exposing, measuring and determining steps. According to a further embodiment, the trimming operation comprises a coarse trimming and assessing operation, and thereafter repeating the exposing, measuring, determining and calculating steps to then perform a fine trimming and assessing operation. According to a still further embodiment, the method further comprises, in the same or a substantially similar test socket (41), exposing the magnetometer unit (20) to other energy sources, using the electrical connection (50), measuring a response of the magnetometer unit (20) to the other energy sources, determining any difference between the measured response and a stored expected response to the other energy sources, and if any substantial difference, performing a trimming operation to reduce the magnitude of the difference.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A test socket for a magnetometer, comprising:
a substantially rigid body having therein a cavity adapted to receive the magnetometer in a predetermined position within the body;
one or more magnetic field sources adapted to provide a magnetic field passing through the predetermined position;
electrical connection within or proximate the test socket for temporary electrical coupling to the magnetometer during testing; and
a pressing element adapted to fit into the cavity to hold the magnetometer in the predetermined position electrically coupled to the electrical connection.

2. The test socket of claim 1, wherein the one or more magnetic field sources comprise one or more electrical coils each having a centerline passing substantially through the predetermined position.

3. The test socket of claim 1, wherein the one or more magnetic field sources comprise three substantially mutually orthogonal electrical coil pairs, wherein each coil pair has a centerline passing substantially through the predetermined position.

4. The test socket of claim 3, wherein the centerlines pass substantially through a common point located within the predetermined position.

5. The test socket of claim 1, wherein the one or more magnetic field sources are substantially fixedly held by the substantially rigid body in predetermined relationship to the predetermined position.

6. The test socket of claim 1, wherein the magnetometer is temporarily attached to the pressing element when inserted into the test socket.

7. The test socket of claim 1, wherein the electrical connection to the magnetometer is held by the pressing element.

8. The test socket of claim 1, wherein the magnetometer has an exterior volume VMAG and the test socket has an exterior volume VTS and a ratio VTS/VMAG is less than $2.8 \times 10^4$.

9. A test socket for a magnetometer, comprising:
a structure having a cavity sized and shaped to retain the magnetometer in a predetermined position during testing;
one or more magnetic field sources embedded in the structure and, when energized, generating a magnetic field passing through the predetermined position; and
one or more electrical connections each having a terminal accessible from the exterior of the structure and extending toward the predetermined position to enable communication with the magnetometer during testing;
wherein the structure comprises:
a socket body in which the cavity is formed; and
a pressing element movable into a position in which the pressing element projects into the cavity to retain the magnetometer in the predetermined position during testing.

10. The test socket of claim 9, wherein the pressing element comprises a cap configured to be matingly inserted into the cavity to move the magnetometer into the predetermined position.

11. The test socket of claim 10, wherein the one or more electrical connections comprise a plurality of test pins extending through the cap.

12. The test socket of claim 10, wherein the cap is configured to be inserted into the cavity along an insertion axis, and wherein the one or more electrical connections comprises a plurality of test pins extending substantially parallel to the insertion axis.

13. The test socket of claim 9, wherein the one or more electrical connections comprise a plurality of test pins extending through a wall of the socket body.

14. The test socket of claim 13, wherein the pressing element comprises a cap configured to be matingly inserted into the cavity to situate the magnetometer in the predetermined position, and wherein the plurality of test pins extend away from cap when matingly inserted into the cavity.

15. The test socket of claim 9, further comprising a slot pair formed in the socket body, and wherein the one or more magnetic field sources comprise a coil pair wound around the slot pair.

16. The test socket of claim 9, further comprising a wireless interface electrically coupled to the one or more electrical connections and embedded within the structure at a location adjacent the predetermined position.

17. A test socket for a magnetometer, comprising:
a socket body having a cavity sized and shaped to hold the magnetometer in a predetermined position during testing;
a first slot pair formed in an exterior portion of the socket body;
a first coil pair wound around the first slot pair and, when energized, generating a magnetic field passing through the predetermined position; and
an electrical interface disposed adjacent the cavity and configured to enable communication with the magnetometer when moved into the predetermined position.

18. The test socket of claim 17, wherein the electrical interface comprises one of the group consisting of a wireless interface disposed adjacent the magnetometer when in the predetermined position and a plurality of connector pins positioned so as to contact terminals provided on the magnetometer when in the predetermined position.

19. The test socket of claim 17, further comprising:
a second slot pair formed in an exterior portion of the socket body; and
a second coil pair wound around the second slot pair and, when energized, generating a magnetic field passing through the cavity;
wherein the first coil pair share a first centerline, wherein the second coil pair share a second centerline, and wherein the first and second centerlines are substantially perpendicular.

* * * * *